United States Patent
Kodama et al.

(10) Patent No.: US 7,102,148 B2
(45) Date of Patent: Sep. 5, 2006

(54) CALIBRATION METHOD AND DEVICE IN ELECTRONIC COMPONENT MOUNTING APPARATUS

(75) Inventors: Seigo Kodama, Chiryu (JP); Shinsuke Suhara, Chiryu (JP); Mizuho Nozawa, Chiryu (JP)

(73) Assignee: Fuji Machine Mfg. Co., Ltd., Chiryu (JP)

(*) Notice: Subject to any disclaimer, the term of this patent is extended or adjusted under 35 U.S.C. 154(b) by 257 days.

(21) Appl. No.: 10/705,974

(22) Filed: Nov. 13, 2003

(65) Prior Publication Data

US 2004/0188642 A1    Sep. 30, 2004

(30) Foreign Application Priority Data

Nov. 13, 2002  (JP) ............................. 2002-329994
Oct. 29, 2003  (JP) ............................. 2003-368435

(51) Int. Cl.
*G01V 8/00*     (2006.01)
*H05K 3/30*     (2006.01)

(52) U.S. Cl. .................. 250/559.44; 250/559.3; 700/121; 29/833; 348/87

(58) Field of Classification Search .......... 250/559.44, 250/559.29, 559.3; 29/833
See application file for complete search history.

(56) References Cited

U.S. PATENT DOCUMENTS 6,216,341 B1 *  4/2001  Nakahara ..................... 29/833
6,550,135 B1 *  4/2003  Nakahara et al. ............. 29/833
6,563,530 B1 *  5/2003  Oyama et al. ................. 348/87
6,785,008 B1 *  8/2004  Uchiyama et al. ........... 356/620
6,876,761 B1 *  4/2005  Okuda et al. ................ 382/151

FOREIGN PATENT DOCUMENTS

JP    4-345445    12/1992
JP    7-19816     1/1995
JP    11-40996    2/1999

* cited by examiner

*Primary Examiner*—Thanh X. Luu
*Assistant Examiner*—Stephen Yam
(74) *Attorney, Agent, or Firm*—Oblon, Spivak, McClelland, Maier & Neustadt, P.C.

(57) ABSTRACT

In an electronic component mounting apparatus capable of replacing a component placing device with any of plural other component placing devices different in performance, the distance between the center line of a component pick-up portion of a replaced component placing device and the optical axis of a board recognizing camera is calibrated easily and precisely. A movable table is positioned so that a reference mark provided on a base frame to reside in the visual field of a component recognizing camera comes in the visual field of a board recognizing camera and that at the same time, the end of the component pick-up portion of the replaced component placing device comes in the visual filed of the component recognizing camera. The board recognizing camera is used to detect the positional relation of the optical axis thereof relative to the reference mark, while the component recognizing camera is used to detect the positional relations of the optical axis thereof relative to the reference mark and relative to the center line of the component pick-up portion. These detected positional relations are used to calculate the positional relation between the optical axis of the board recognizing camera and the center line of the component pick-up portion.

7 Claims, 10 Drawing Sheets

CALIBRATION METHOD AND DEVICE IN ELECTRONIC COMPONENT MOUNTING APPARATUS

INCORPORATION BY REFERENCE

This application is based on and claims priority under 35 U.S.C. sctn. 119 with respect to Japanese Applications No. 2002-329994 filed on Nov. 13, 2002 and No. 2003-368435 filed on Oct. 29, 2003, the entire contents of which are incorporated herein by reference.

BACKGROUND OF THE INVENTION

1. Field of the Invention

The present invention relates to a calibration method and device in an electronic component mounting apparatus for mounting electronic components on substrates or circuit boards. In particular, it relates to a calibration method and device for preventing errors in the mounting position of components when a component placing device replaces another which is different in performance.

2. Discussion of the Related Art

Electronic components that are mounted on circuit boards by electronic component mounting apparatuses of this type include small-type electronic components which are used in a large quantity such as chips and large type electronic components which are used in a small quantity but many in the kinds of shapes or which are needed to be mounted precisely such as ICs having fine leads. Generally, small-type electronic components used in a large quantity are mounted using a high-speed, small component mounting apparatus with a plurality of suction nozzles, whereas large-type electronic components are mounted using a different-shape-component mounting apparatus which is slow in operation speed but has such a flexibility as to deal with various kinds of components and a high accuracy mounting function. Therefore, it has been often the case that a known electronic component mounting line is constructed by arranging a high-speed, small-component mounting apparatus and a different-shape-component mounting apparatus in series. Or, it is has also been practiced that an electronic component mounting line is constructed using a plurality of electronic component mounting apparatus each having both of a high-speed, small-component mounting function and a different-shape-large-component mounting function therein.

However, the ratio at which small electronic components and large electronic components are mounted on circuit boards changes in dependence on the types of the circuit board to be produced. Therefore, in the former method of constructing an electronic component mounting line in a combination of high-speed, small-component mounting apparatuses and different-shape-component mounting apparatuses, the mounting operation of electronic components must be carried out with either one of the electronic component mounting apparatus being lowered in operation efficiency, whereby a problem arises in that it is impossible to build an electronic component mounting line capable of always attaining the maximum productivity. On the other hand, in the latter method of using the electronic component mounting apparatuses each having both of the high-speed, small-component mounting function and the different-shape large-component mounting function, it may take place depending on whether the components to be mounted are small electronic components or large electronic components that each of the electronic component mounting apparatuses would have over-function in some respects than as required. This causes a problem that the cost for the equipment rises to be reflected on an increase in the component mounting cost. Further, new types of components to be mounted on circuit boards are developed day by day, thereby making it impossible to predict the new types at the time of designing the electronic component mounting apparatus. Therefore, in designing electronic component mounting apparatuses, it has to be taken into consideration to deal with more types of components than those present at the time of such designing, which disadvantageously results in redundant or excess equipments thereby increasing the cost for equipments.

On the other hand, as disclosed for example in Japanese unexamined, published patent application No. 7-19816 (1995-19816), there has been proposed a method of building an optimum component mounting line which is capable of meeting the ratio of small components to large components which are mounted on circuit boards to be produced as well as on the types of the components used therein, by making it possible that a component placing device which holds and mounts electronic components can be replaced by the worker with another in a short time at the site where the component mounting line is installed.

In an electronic component mounting apparatus of the type as shown in FIG. 5, a component placing device 26 provided with a component placing head 28 and a board recognizing camera 25 are installed on a movable table 24 that is supported movably in X direction end Y direction with respect to a base frame 11, and a component recognizing camera 15 is fixed on the base frame 11. The electronic component mounting apparatus 10 detects, by the board recognizing camera 25, the position of a board mark Sm provided on the circuit board S that has been loaded, positioned and held by a circuit board transfer device 12, then moves a slide 21 and the movable table 24 respectively in the X and Y directions to perform the position compensation based on the detected position of the board mark Sm and then mounts a component P which has been taken out from a component supply device 13 and has been held at the end of a suction nozzle 29 of a component placing head 28, at a programmed coordinate position on the circuit board S. Further, in the mid course that the component P held at the end of the suction nozzle 29 is moved from the component supply device 13 to the programmed coordinate position on the circuit board S, the feed movement of the suction nozzle 29 is once stopped in alignment with the component recognizing camera 15. Thus, the deviation of the center of the component P from the center line O3 of the suction nozzle 29 (hereinafter also referred to as "suction nozzle center line O3") is detected by the component recognizing camera 15, so that the feed amounts of the slide 21 and the movable table 24 are compensated for the deviation. In this manner, the component P can be mounted precisely at the programmed target coordinate position on the circuit board S.

In the case that plural component placing devices of different kinds or types are selectively and replaceably installed to the base structure of the mounting apparatus as mentioned earlier, it is required to do a precise calibration for correcting the positional relation between an optical axis O1 of the board recognizing camera 25 (hereinafter referred to as "board camera optical axis O1") and the center line O3 of the suction nozzle 29 (i.e., the distance X4 in the X-direction and the distance Y4 in the Y-direction as shown in FIG. 1 which shows a part of FIG. 5 in an enlarged scale) after the replacement of the component placing device 26. This calibration is essential to mount the components P precisely at the programmed target positions on the circuit board S. Further, in order to precisely compensate for the deviation of the center of the component P from the center line O3 of the suction nozzle 29, the component P is to be detected by the component recognizing camera 15, with the positional relation between the suction nozzle center line O3 and the optical axis O2 of the component recognizing camera 15 (hereinafter referred to as "component camera optical axis O2") being grasped correctly.

A method of measuring and calibrating the positional relation (distance X4 and distance Y4) between the optical axis O1 of the board recognizing camera 25 and the center line O3 of the suction nozzle 29 of the component placing device 26 is described as prior art in Japanese unexamined, published patent No. 07-19816. In this method, a component (or a jig, hereinafter the same) held by an suction nozzle is mounted on a circuit board, a board recognizing camera is moved over the component to measure the positional relation between the optical axis of the board recognizing camera and the component, and the positional relation between the optical axis of the board recognizing camera and the center line of the suction nozzle of the component placing device is calibrated based on the measured positional relation and the feed amount and direction of the board recognizing camera. However, there remains a problem that the measuring method involves errors in the shape of the component as well as in the holding position on the suction nozzle.

In the technology disclosed in the Japanese unexamined, published patent No. 07-19816 above, a measuring jig is used which is provided with a first reference mark Gm1 and a second reference mark Gm2 which as references, correspond respectively to a position where the jig is attached to the suction nozzle and another position which the board recognizing camera faces at the same time. In the state that the measuring jig is attached to the suction nozzle with the first reference mark Gm1 being in alignment with the suction nozzle, the first reference mark Gm1 is recognized by a component recognizing camera, and then, the suction nozzle with the measuring jig held thereon is moved relative to the component recognizing camera, so that the second reference mark Gm2 is recognized by the component recognizing camera and then, by the board recognizing camera. Thus, there are gathered the position of the second reference mark recognized by the board recognizing camera, the positions of the first and second reference marks recognized by the component recognizing camera, and the feed distance of the measuring jig. And, the setting position of the board recognizing camera with respect to the suction nozzle is detected based on these gathered data. In this method, since the simple measuring jig only is required to prepare, the setting position of the board recognizing camera with respect to the suction nozzle can be measured sufficiently precisely at a reduced cost for materials required therein. Further, when the measuring jig is held to the suction nozzle, automatic measurement can be done under the control of a control device of the electronic component mounting apparatus or the like, so that an advantage can be obtained in that there can be eliminated errors in measurement which may otherwise be caused in dependence on the degree in skill of the worker.

However, in the method described in the aforementioned Japanese published patent, reference marks are provided at the positions respectively corresponding to the suction nozzle and the board recognizing camera, and thus, the measuring jig made large in size has to be held on the suction nozzle with one of the reference marks being in alignment with the same. This may disadvantageously cause the suction nozzle to be deformed due to the gravity of the measuring jig, thereby resulting in measurement errors, or causes the measuring jig to be detached from the suction nozzle with a small external force. Therefore, problems arise in that it is not easy to practice to measure the setting position of the board recognizing camera relative to the suction nozzle with the measuring jig being held not to be detached from the suction nozzle.

SUMMARY OF THE INVENTION

It is therefore a primary object of the present invention to provide an improved calibration method and device capable of easily and precisely calibrating the distance between the center line of a component pick-up portion of a component placing device and the optical axis of a board recognizing camera after installation of the component placing device in an electronic component mounting device of the type wherein plural component placing devices different in kinds or performance can be used replaceably.

According to the present invention, there is provided a calibration method and device in an electronic component mounting apparatus, which comprises a circuit board transfer device mounted on a base frame for performing the loading, unloading and positioning of circuit board, a movable table supported on the base frame movably in two directions of X and Y directions, and a component placing device installed on the movable table for taking out components supplied by a component supply device and mounting the components on the circuit board positioned on the circuit board transfer device. The apparatus further comprises a board recognizing camera fixed on the movable table, and a component recognizing camera fixed on the base frame. The component placing device is replaceable with another component placing device different in performance. The method or device includes a step or means for providing a reference mark on the base frame within the visual field of the component recognizing camera, and a step or means for positioning the movable table to a predetermined position relative to a coordinate origin to make the reference mark come in the visual field of the board recognizing camera. The method or device further includes a step or means for calculating a positional relation between optical axes of the board recognizing camera and the component recognizing camera when the movable table is positioned at the predetermined position, based on respective positional relations of the reference mark relative to the optical axes of the component recognizing camera and the board recognizing camera, the respective positional relations being detected by the component recognizing camera and the board recognizing camera.

With this construction, the movable table is stopped at the predetermined position relative to the coordinate origin so that the reference mark provided on the base frame to be within the visual field of the component recognizing camera comes within the visual field of the board recognizing camera. The component recognizing camera and the board recognizing camera detect the respective positional relations of their optical axes relative to the reference mark. Thus, there can be calculated the positional relation between the optical axes of the board recognizing camera and the component recognizing camera with the movable table being at the predetermined position.

In the calibration method and device according to the present invention, since the reference mark is provided on the base frame thereby to be held stably, the respective positional relations of the optical axes of the both cameras relative to the reference mark can be detected reliably in a stable state. And, when the movable table is stopped at the predetermined position with respect to the coordinate origin, the position of the optical axis of the component recognizing camera relative to the coordinate origin can be calibrated precisely based on the position of the optical axis of the board recognizing camera relative to the coordinate origin.

BRIEF DESCRIPTION OF THE DRAWINGS

The foregoing and other objects and many of the attendant advantages of the present invention may readily be appreciated as the same becomes better understood by reference to the preferred embodiments of the present invention when considered in connection with the accompanying drawings, wherein like reference numerals designate the same or corresponding parts throughout several views, and in which.

DESCRIPTION OF PREFERRED EMBODIMENTS OF THE INVENTION

Figure 5:
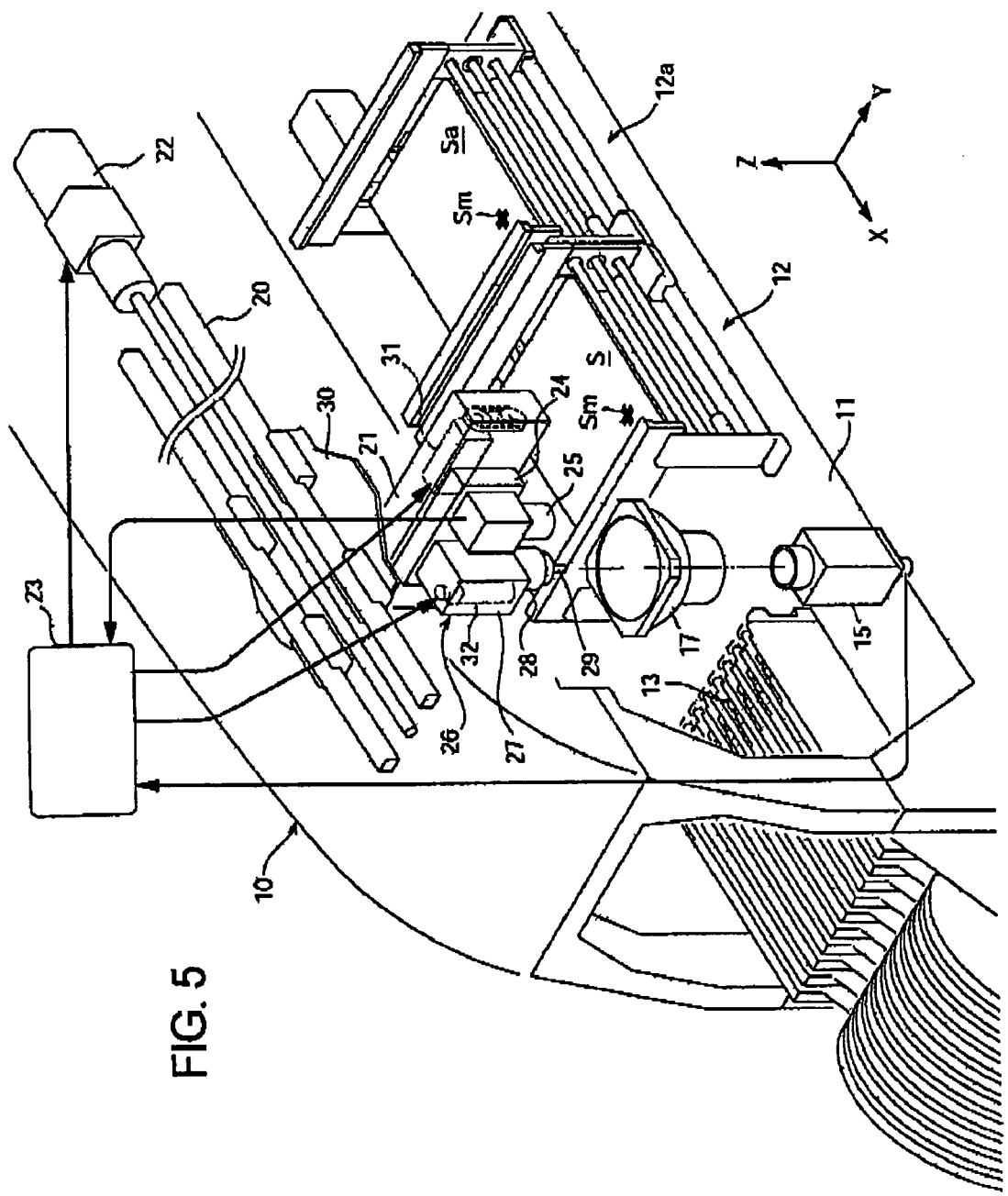
FIG. 5 is a general perspective view showing important parts of the electronic component mounting device wherein a component replacing device installed thereon can be replaced with any one of those different types.

A calibration method and device in an electronic component mounting apparatus in the first embodiment will be described hereinafter with reference to shown in FIGS. 1 to 3, 5 and 6. A plurality of electronic component mounting apparatuses 10, whose entire construction is schematically shown in FIG. 5 and to which the first embodiment is applied, are arranged in a line to constitute a component mounting line, As shown in FIG. 5, two circuit board transfer devices 12 and 12a are provided on a base frame 11 of each electronic component mounting apparatus 10 for respectively transferring circuit boards S and Sa in Y direction. Though not shown, the plural electronic component mounting apparatuses 10 are installed as being adjoined to the next thereto to be in series in the Y direction. The respective circuit board transfer devices 12 and 12a of the plural electronic component mounting apparatuses 10 are operated in connection with each other, whereby the respective circuit boards S and Sa are sequentially fed to the circuit board transfer devices 12 and 12a next thereto in the transfer direction to be positioned and held at respective predetermined positions thereon.

Over each of the circuit board transfer devices 12 and 12a, a slide 21 slender in the Y direction is fixed to a lower surface of a table 30, which is movably guided and supported along fixed rails 20 extending in the X direction orthogonal to the Y direction. The movement of the slide 21 in the X direction is controllable by a servomotor 22 through a ball screw (not numbered). On one side of the slide 21, a movable table 24 installing a board recognizing camera 25 and a component placing device 26 thereon is supported and guided movably in the Y direction, and the movement of the movable table 24 is controllable by a servomotor 31 through a ball screw (not shown). The slide 21, the movable table 24 and the board recognizing camera 25 and the component placing device 26 mounted on the movable table 24 are provided over each of the circuit board transfer devices 12 and. 12a. The slide 21, the movable table 24, the board recognizing camera 25 and the component placing device 26 provided over the circuit board transfer device 12 are substantially the same in construction and function thereof as those provided over the circuit board transfer device 12a, and therefore, FIG. 5 omits from showing those provided over the circuit board transfer device 12a. Further, in the following description, the constructions and operations of the slide 21, the movable table 24 end the like will be described only those provided over the circuit board transfer device 12. It is to be noted herein that the present invention can be applied not only to the electronic component mounting apparatus 10 provided with the two circuit board transfer devices 12, 12a, but also to that provided with a single circuit board transfer device.

As those to be mounted on the movable table 24, there are prepared component placing devices 26 of various types and different performances for use in high-speed mountings of small electronic components as well as for use in mountings of different-shape, large electronic components, and these component placing devices 26 can be selectively installed and used on the movable table 24. The electronic component mounting apparatus 10 described in this particular embodiment is comprised of two sections; one corresponding to the replaceable component placing device 26 and the other corresponding to the base construction thereof including all the components or parts except for the component placing device 26.

Figure 1:
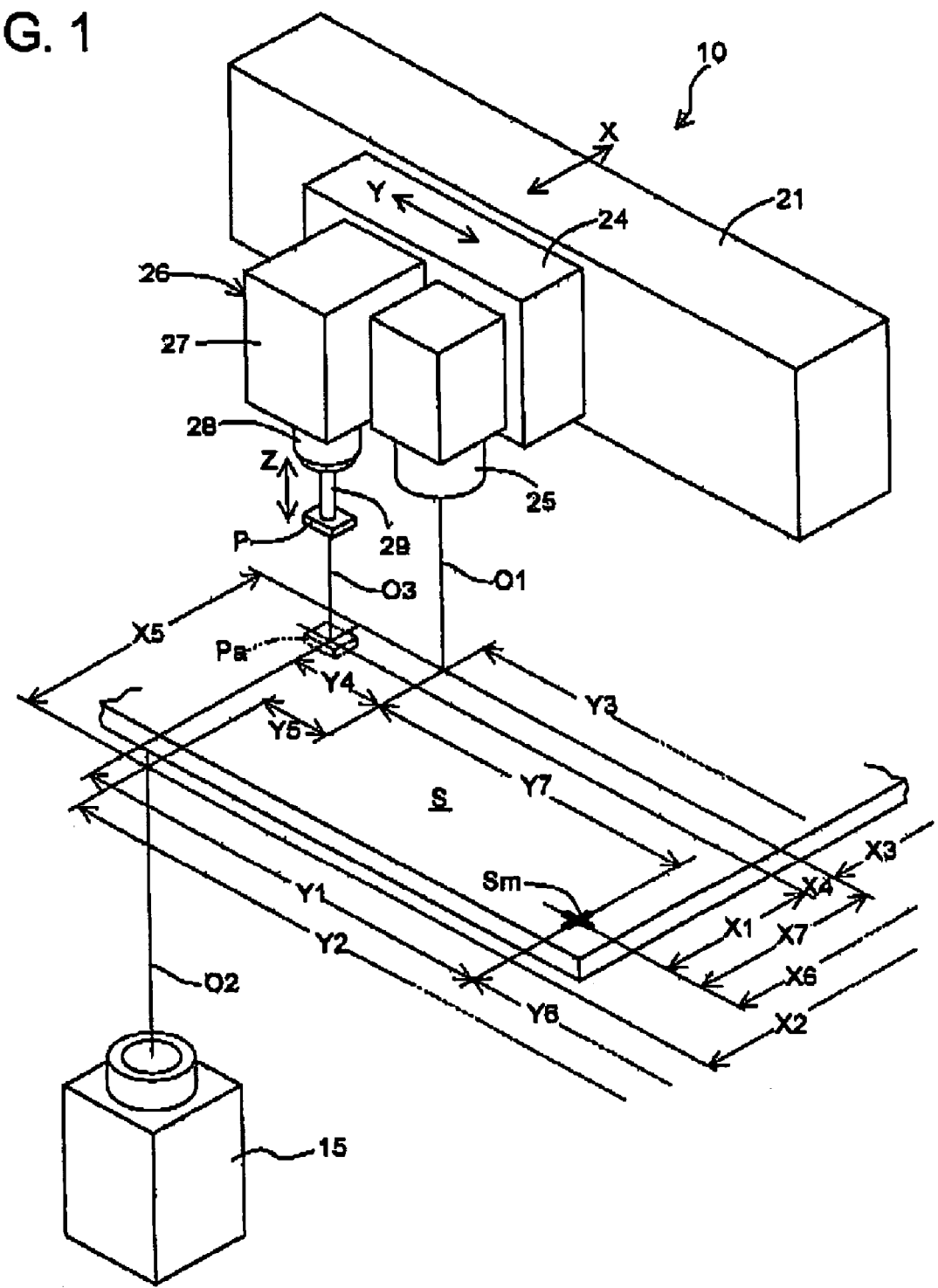
FIG. 1 is a perspective explanatory view showing the positional relation among the positions of primary parts of an electronic component mounting apparatus wherein a component replacing device installed thereon can be replaced with any one of those different types.
Figure 2:
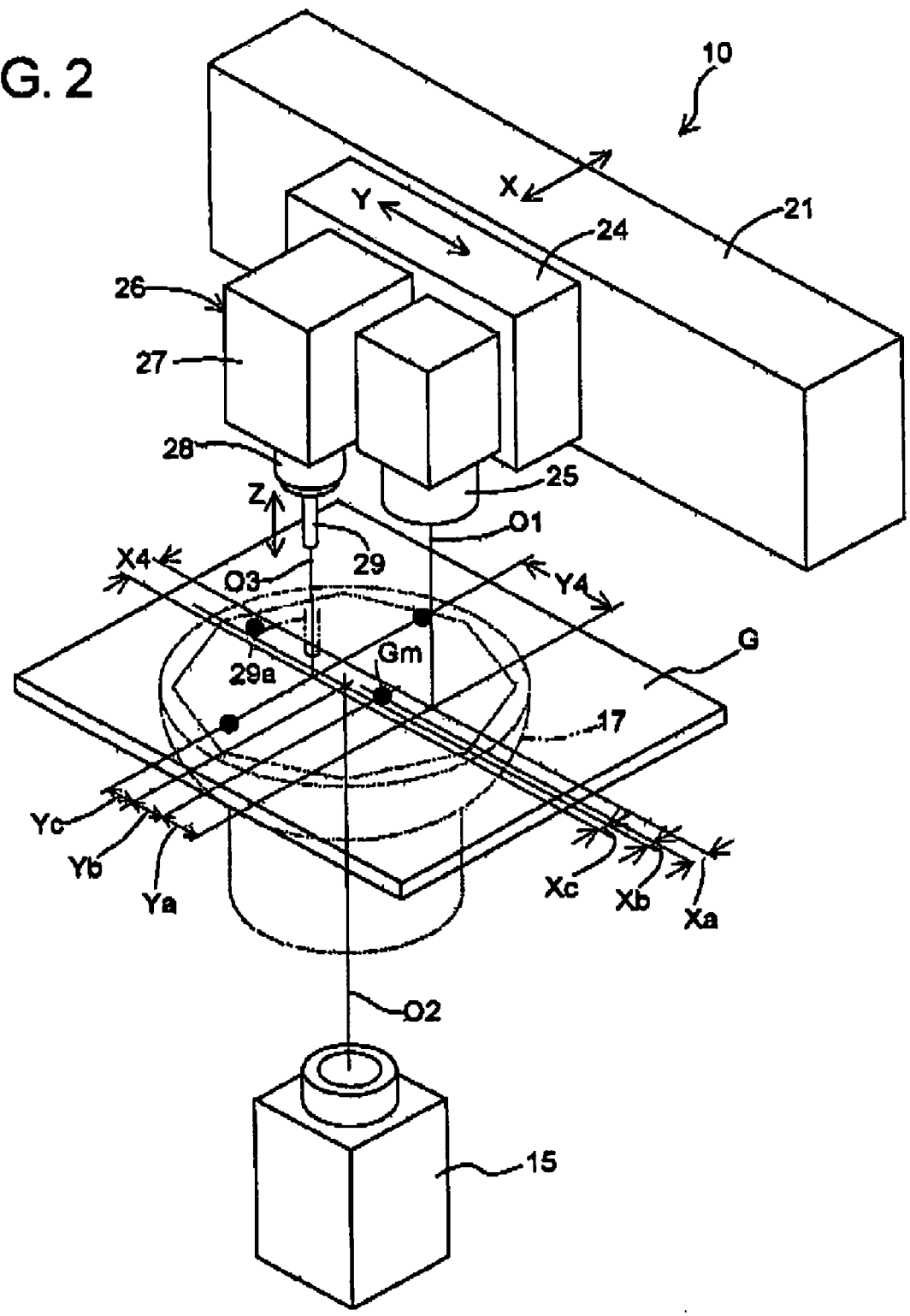
FIG. 2 is another perspective explanatory view illustrating important parts in a calibration method in the first embodiment.

As shown in FIGS. 1, 2, and 5, each component placing device 26 is comprised of a support base 27 detachably installed on the movable table 24, a component placing head 28 guide and supported on the support base 27 to be movable vertically in the Z direction orthogonal to both of the X an Y directions and controllable to be moved vertically by a servomotor 32 through a ball screw (not shown), and a cylindrical suction nozzle (component pick-up portion) 29 arranged being protruded downward from the component placing head 28 and capable of holding a component P at the lower end thereof. The center line O3 of the component placing head 28 and the suction nozzle 29 is in parallel relation to the Z direction, and the suction nozzle 29 is supported on the component placing head 28 to be rotatable about the center line O3, wherein the rotational angle of the suction nozzle 29 is controllable by a servomotor (not shown). The board recognizing camera 25 is fixed to the movable table 24 with the optical axis O1 thereof being in parallel relation to the Z direction and is not replaced with another camera except for the case that it has been fallen into failure or the like.

Figure 6:
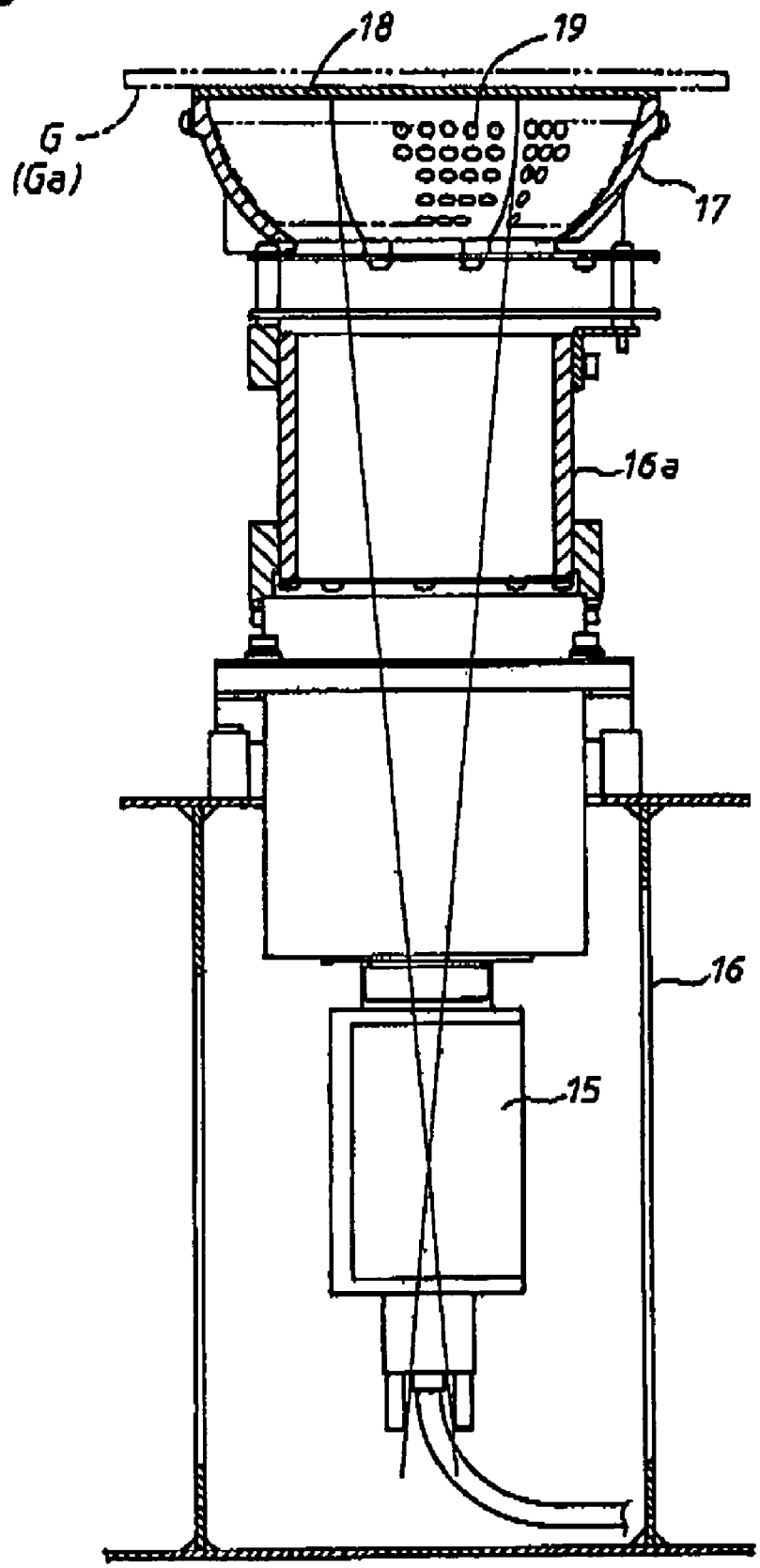
FIG. 6 is a sectional view showing the supporting structure for an upper end member supporting a reference gauge and for a component recognizing camera.

At one end side of the electronic component mounting apparatus 10, there is provided a component supply device 13, which is comprised of a plurality of feeders arranged in juxtaposed relation with one another, On the base frame 11 between the circuit board transfer device 12 and the component supply device 13, a component recognizing camera 16 is provided with an optical axis O2 thereof being in parallel relation to the Z direction. This component recognizing camera 15 is mounted on the base frame 11 through a supporting table 16, as shown in. FIG. 6, and over the component recognizing camera 15, an upper end member (support member) 17 of a bottomless bowl shape opening upward is attached through a connecting member 16a in coaxial alignment with the optical axis O2. The open upper face of the upper end member 17 is covered with a transparent cover glass 18, and a side emitting light source 19 comprised of numerous LEDs (Light Emitting Diodes) is arranged on the inner spherical surface of the upper end member 17 to illuminate from below the component P and the lower end of the suction nozzle 29 which are to be recognized by the component recognizing camera 15.

In FIGS. 1 and 5, the electronic component mounting apparatus 10 detects, by the board recognizing camera 25, the position of a circuit board mark Sm provided on the circuit board S which is loaded and positioned by the circuit board transfer device 12, then performs position compensation based on the detected position of the circuit board mark Sm and then moves the slide 21 and the movable table 24 in the X and Y directions, so that the electronic component P taken from the component supply device 13 and held at the end of the suction nozzle 29 of the component placing device 26 can be mounted at a commanded coordinate position on the circuit board S. Further, in the mid course that the component P held at the end of the suction nozzle 29 is moved from the component supply device 13 to the commanded coordinate position on the circuit board S, the electronic component mounting apparatus 10 temporally stops the suction nozzle 29 over the component recognizing camera 15 and detects the deviation of the center of the component P held on the suction nozzle 29 from the center line O3 of the suction nozzle 29 and the deviation in angle of the component P about the center line O3 by the component recognizing camera 15. The deviation in angle about the center line O3 is corrected by rotating the suction nozzle 29 by the servomotor based on the detected result of the angle deviation, and then, the feed amounts of the slide 21 and the movable table 24 in the X and Y directions are corrected based on the detected result of the center deviation, so that the component P is precisely mounted at a commanded coordinate position (X1, Y1 in FIG. 1) which is designated by reference to the circuit board mark Sm on the circuit board S.

As described above, the electronic component mounting apparatus 10 in this particular embodiment is comprised mainly of the apparatus base section and the component placing device 26 which can be replaceably installed on the movable table 24 thereof. Therefore, in order to precisely mount the component P at the commanded coordinate position (X1, Y1) which is designated by reference to the circuit board mark Sm as reference on the circuit board S it is necessary to precisely calibrate the positional relation (the distance X4 in the X direction and the distance Y4 in the Y direction) between the optical axis O1 of the board recognizing camera 25 and the center line O3 of the suction nozzle 29 of the component placing device 26 which has been installed on the movable table 24 to replace an old one. Further, in order to precisely detect the deviation of the center of the component P from the center line O3 of the suction nozzle 29 it is necessary to detect the component P by the component recognizing camera 15 in the state that the positional relation between the suction nozzle center line O3 and the optical axis O2 of the component recognizing camera 15 has been grasped precisely at the time of such detection. For these purposes, it is necessary to precisely calibrate the positional relation (the distance X2 in the X direction and the distance Y2 in the Y direction) between the coordinate origin of the electronic component mounting apparatus 10 and the component recognizing camera optical axis O2. In addition, such calibration is to be done each time the component recognizing camera 15 is installed to replace another.

Figure 3:
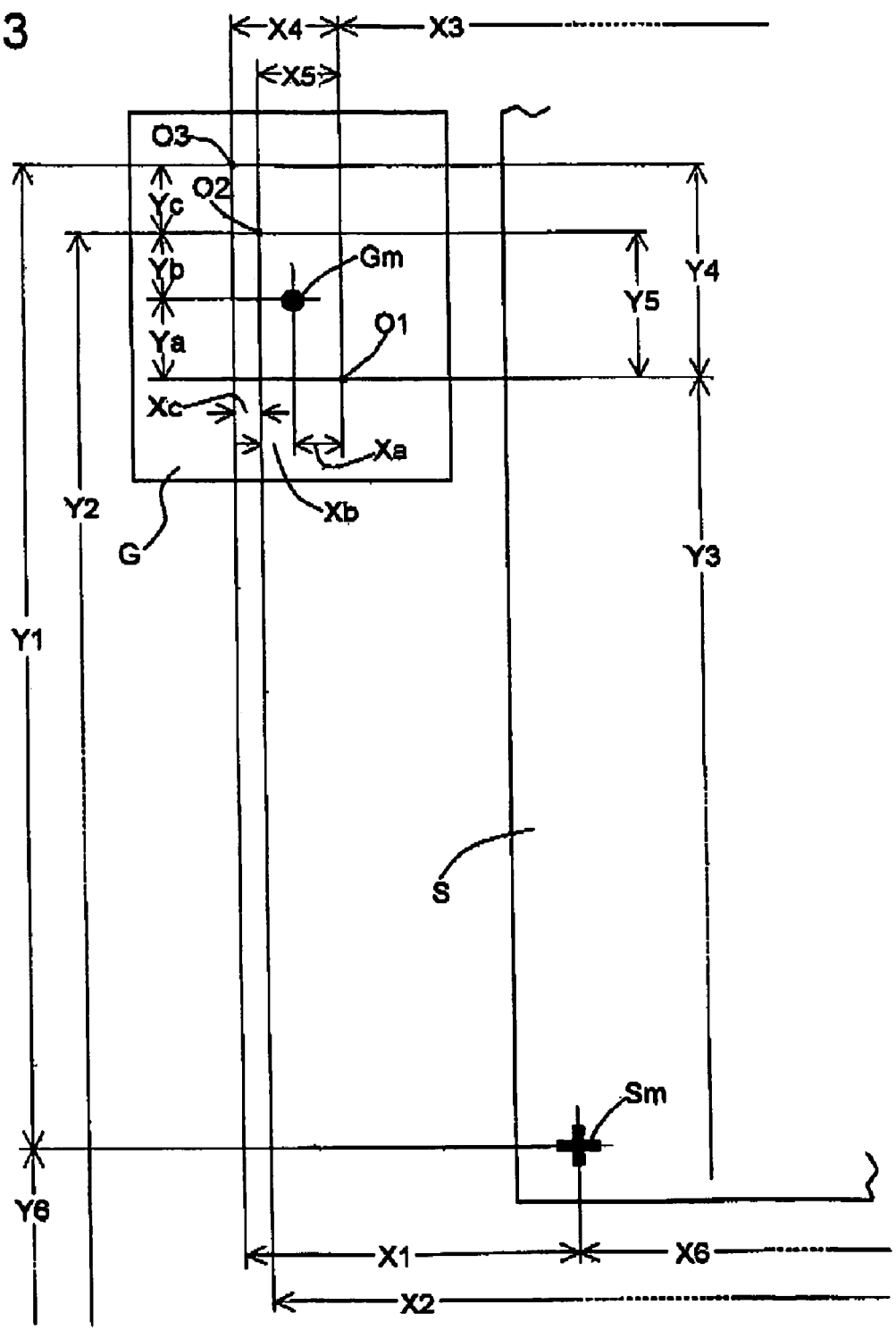
FIG. 3 is an explanatory view illustrating the calibration method in the first embodiment.

Next, the operation in the first embodiment for performing these calibrations will be described with reference mainly to FIGS. 1 to 3. Prior to this operation, as shown in FIGS. 2 and 3, a reference gauge G which is provided with one or several reference marks Gm of each such a shape as spot, cross, or the like on a colorless, transparent glass plate is set on a cover glass 18 of the upper end member 17 with the reference mark or marks Gm residing in the visual field of the component recognizing camera 15. Then, the movable table 24 is moved to and stopped at such a predetermined position that the reference mark Gm comes in the visual field of the board recognizing camera 25 and that at the same time, the end of the suction nozzle 29 of the component placing device 26 remains or resides in the visual field of the component recognizing camera 15. The positional relation (distance X3 and distance Y3 in FIG. 3) of the circuit board camera optical axis O1 with respect to the coordinate origin of the electronic component mounting device 10 at this time is detected as the feed amounts of the slide 21 and the movable table 24 from the coordinate origin by a position detection device such as inductosyn or the like and is recorded in a memory (not shown) of a control device 23. In this stop state, the reference mark Gm is in the depth of focus of each of the respective cameras 15 and 25 for component recognition and circuit board recognition. Then, the suction nozzle 29 is descended down to make the end thereof approach the reference gauge G thereby to take a position (refer to the two-dot chain line in FIG. 2) within the depth of focus of the component recognizing camera 15.

As described above, when the movable table 24 is positioned at such predetermined position that the circuit board camera optical axis O1 is moved by the distance X3 and the distance Y3 from the coordinate origin in FIG. 3, the board recognizing camera 25 measures the positional relation (distance Xa and distance Ya) between the circuit board camera optical axis O1 and the reference mark Gm based on the position of the image of the reference mark Gm. The component recognizing camera 15 measures the positional relation (distance Xa and distance Ya) between the component camera optical axis O2 and the suction nozzle center line O3 based on the position of the image of the end of the suction nozzle 29 and further measures the positional relation (distance Xb and distance Yb) between the component camera optical axis O2 and the reference mark Gm based on the position of the image of the reference mark Gm.

As mentioned earlier, in order to mount the component P precisely at a programmed predetermined coordinate position on the circuit board S from the reference of the circuit board mark Sm, the positional relation (distance X4 in the X direction and distance Y4 in the Y direction) between the optical axis O1 of the board recognizing camera 25 and the center line O3 of the suction nozzle 29 of the component placing device 26 has to be calibrated each time the component placing device 26 is installed on the moving slide 24 to replace another. The values for the calibration are given by the following equations, as understood easily in FIGS. 2 and 3.

$$X4=Xa+Xb+Xc \quad (1a)$$

$$Y4=Ya+Yb+Yc \quad (1b)$$

When the movable table 24 is positioned at such a commanded position that the circuit board camera optical axis O1 is moved by the distance X3 and the distance Y3 from the coordinate origin in FIG. 3, the calibration values for the positional relation (distance X5 in X direction and distance Y5 in Y direction) between the optical axis O1 of the board recognizing camera 25 and the optical axis O2 of the component recognizing camera 15 are given by the following equations, as understood in FIG. 3.

$$X5=Xa+Xb \quad (2a)$$

$$Y5=Ya+Yb \quad (2b)$$

Further, when the movable table 24 is positioned at such a commanded position that the circuit board camera optical axis O1 is moved by the distance X3 and the distance Y3 from the coordinate origin in FIG. 3, the calibration values for the positional relation (distance X2 in the X direction and distance Y2 in the Y direction) of the component camera optical axis O2 relative to the coordinate origin are given, as understood in FIG. 3, by the following equations which are based on the values X5, Y5 given by the above equations and the positional relation X3, Y3 recorded in the memory of the control device 23 as mentioned earlier, of the circuit board camera optical axis O1 relative to the coordinate origin.

$$X2=X3+X5 \quad (3a)$$

$$Y2=Y3+Y5 \quad (3b)$$

Therefore, when the image of the component P held by the suction nozzle 29 is taken by the component recognizing camera 15, the position of the center line O3 of the component P with respect to the coordinate origin can be obtained from the positional relation of the component camera optical axis O2 relative to the coordinate origin. Thus, the deviation of the component P held on the suction nozzle 29 from the center line O3 of the same can be computed finally y the control device 23.

The positive or negative sign of each distance Xa, Xb, . . . in the above equations changes in dependence on the positional relation between the center line O3, the optical axis O1, and the optical axis O2.

After the component placing device 26 replaces another, the control device 23 for controlling the operation of the electronic component mounting apparatus 10 first feeds the movable table 24 to the predetermined position shown in FIGS. 2 and 3 and positions the movable table 24 there. In the state that the reference gauge G is set on the upper end member 17 over the component recognizing camera 15, the control device 23 then measures the aforementioned distances Xa, Ya by the board recognizing camera 25 and the aforementioned distances Xb, Yb, and Xc, Yc by the component recognizing camera 15. Next, the control device 23 computes the calibration values for the distances X4, Y4 by the equations (1a) and (1b), the calibration values for the distances X5, Y5 by the equations (2a),and (2b), and the calibration values for the distances X2, Y2 by the equations (3a) and (3b).

When a circuit board S is loaded by the circuit board transfer device 12, the control device 23 moves the slide 21 and the movable table 24 in the X direction and the Y direction and takes out a programmed or designated component P from the component supply device 13 to hold on the end of the suction nozzle 29. Next, the movable table 24 is moved to another predetermined position so that the image of the component P held on the suction nozzle 29 is taken by the component recognizing camera 15. The distances of the center line of the image of the component P from the coordinate origin are obtained based on the calibration values X2, Y2 for the positional relation of the component camera optical axis O2 relative to the coordinate origin. The difference is calculated between the distances of the suction nozzle center line O3 from the coordinate origin, which are calculated from the calibration values X4, Y4 of the positional relation between the circuit board camera optical axis O1 and the suction nozzle center line O3, and the distances of the center line of the component P from the coordinate origin. Thus, the deviation of the component P from the suction nozzle center line O3 is calculated from the difference. Accordingly, the position of the components P is compensated for the calculated deviation from the suction nozzle center line O3, so that the component P can be mounted precisely at a commanded target position on the circuit board S. At this time, the calibration is carried out for the positioning error of the circuit board S which error is calculated based on the deviation of the circuit board mark Sm whose image has been taken by the board recognizing camera 25. Further, when an angular deviation of the component P about the center line O3 is detected by the component recognizing camera 15, the suction nozzle 29 is rotated to correct the angular deviation of the component P.

In this particular embodiment, a plurality (e.g., four) of reference marks Gm may be provided on the reference gauge G with proper distances being kept therebetween in the X and Y axis directions so that all the reference marks Gm remain in the visual field of the component recognizing camera 15. In this case, respective calibration values for the plural reference marks Gm are calculated, and the average value of the respective calibration values is computed, so that more precise calibration value can be obtained.

In the first embodiment, described above, the reference mark Gm of the reference gauge G set on the upper end member 17 is kept in both the visual fields of the component recognizing camera 15 and the board recognizing camera 25. However, where the center line O3 of the suction nozzle 29 and the optical axis O1 of the board recognizing camera 25 are made further apart from each other, it may become impossible to make the reference mark Gm and the end of the suction nozzle 29 come in the visual field of the component recognizing camera 15 and at the same time, to make the reference mark Gm come in the visual field of the board recognizing camera 25. In this modified case, the reference gauge G is set on the upper end member 17 so that the reference mark Gm is made come in the visual field of the component recognizing camera 15, and then, the movable table 24 is fed to be stopped at a first position where the reference mark Gm comes in the visual field of the component recognizing camera 25. With the movable table 24 being positioned at this first position, the positional relation X5, Y5 between the circuit board camera optical axis O1 and the component camera optical axis O2 is detected from the respective positional relations of the optical axes O1 and O2 of the respective cameras 25, 15 relative to the reference mark Gm.

Next, the movable table 24 is moved to a second position so that the end of the suction nozzle 29 is made come in the visual field of the component recognizing camera 15, in which state the positional relation Xc, Yc between the component camera optical axis O2 and the suction nozzle center line O3 is detected by the component recognizing camera 15, and the positional relation X4, Y4 between the circuit board camera optical axis O1 and the suction nozzle center line O3 can be calculated based on the positional relation X5, Y5 between the circuit board camera optical axis O1 and the component camera optical axis O2 detected at the first position, the positional relation Xc, Yc between the component camera optical axis O2 and the suction nozzle center line O3 detected at the second position, and the positional relation Xe, Ye (not shown) between the first position and the second position. In this case, the values of the distances X4 and X5 are those which are made by adding the value Xe to the values respectively calculated by the aforementioned equations 1a and 2a, and the values of the distances Y4 and Y5 are those which are made by adding the value Ya to the values respectively calculated by the aforementioned equations 1b and 2b. Other respects in this modified case are the same as mentioned earlier.

(Second Embodiment)

In the modification as described above, the measurements of the distances Xa, Ya, Xb, Yb, Xc, and Yc are laborious, because they must be done twice with the movable table 24 positioned at the first position and the second position. In the second embodiment shown in FIG. 4, however, even in the case that the suction nozzle center line O3 and the circuit board camera optical axis O1 are set further apart from each other, the calibration for the positional relation between the circuit board camera optical axis O1 and the component camera optical axis O2 and the calibration for the positional relation between the circuit board camera optical axis O1 and the suction nozzle center line O3 can be done with the movable table 24 being maintained stopped at a single predetermined position as is the case of the foregoing first embodiment.

Figure 4:
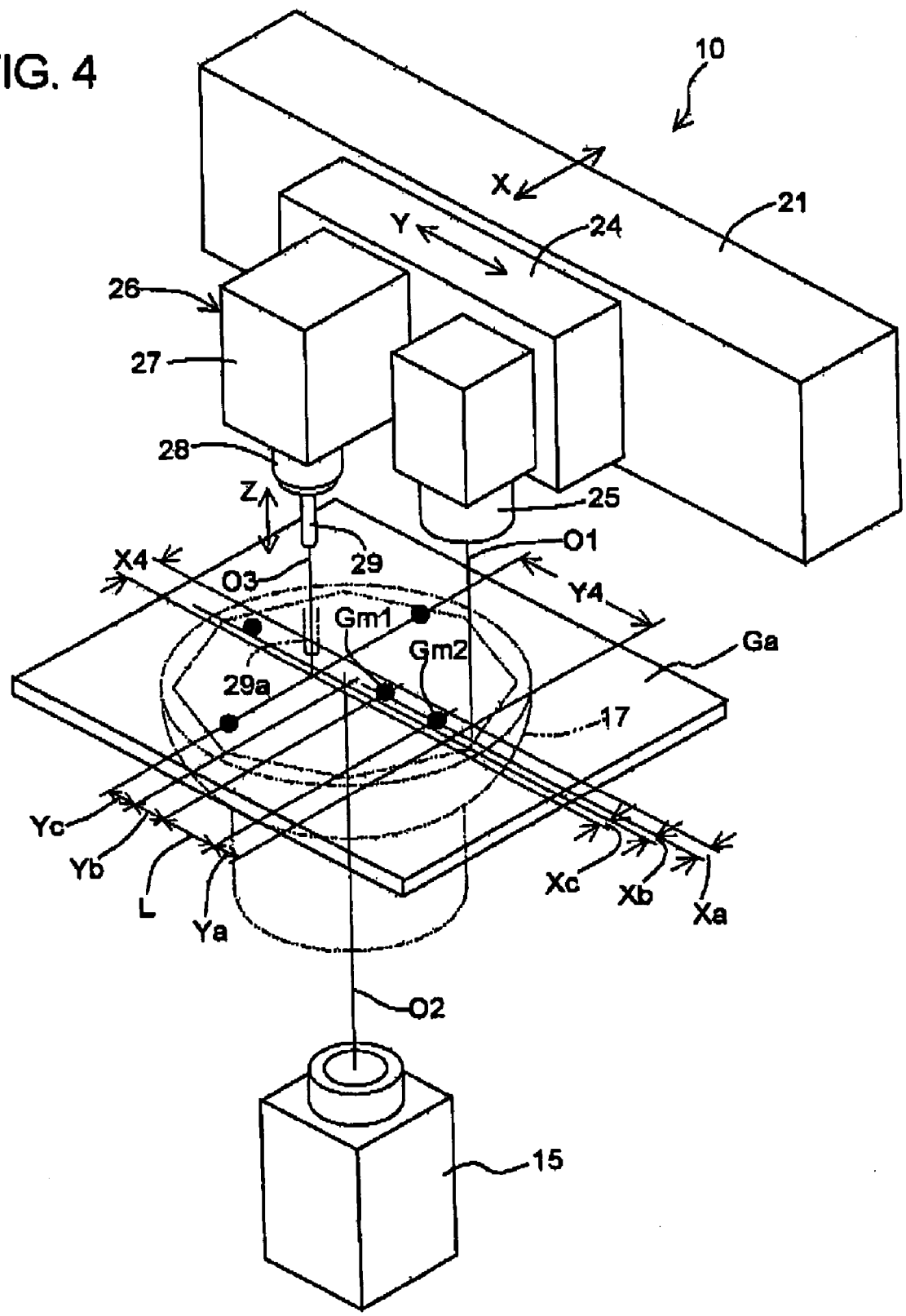
FIG. 4 is another perspective explanatory view illustrating important parts in a calibration method in the second embodiment.

The second embodiment is different from the first embodiment in that a reference gauge Ga provided with first and second reference marks Gm1 and Gm2 spaced by a distance L is used instead of the reference gauge G described above. Next, the operation in the second embodiment will be described. Also in the second embodiment, prior to the operation for calibration, the reference gauge Ga is set on the cover glass 18 of the upper end member 17 so that the first and second reference marks Gm1 and Gm2 have such a predetermined positional relation as shown in FIG. 4. That is, the reference gauge Ga is set, for example, to make a line connecting the first and second reference marks Gm1 and Gm2 extend in parallel relation to the Y axis and at the same time, to make the first reference mark Gm1 come in the visual field of the component recognizing camera 15. To this end, the movable table 24 is moved to be stopped at such a predetermined position that the second reference mark Gm2 is made come in the visual filed of the board recognizing camera 25 and that at the same time, the end of the suction nozzle 29 is made come in the visual field of the component recognizing camera 15. The positional relation (those same as the distance X3 and the distance Y3 in FIG. 3) of the optical axis O1 of the board recognizing camera 25 with respect to the coordinate origin at that time is recorded in the memory of the control device 23 for controlling the operation of the electronic component mounting apparatus 10.

In this state, the component recognizing camera 15 measures the positional relation (distance Xc and distance Yc) between the optical axis O2 thereof and the suction nozzle center line O3 and the positional relation (distance Xb and distance Yb) between the optical axis O2 thereof and the first reference mark Gm1. And, the board recognizing camera 25 measures the positional relation (distance Xa and distance Ya) between the optical axis O1 thereof and the second reference mark Gm2.

In the second embodiment, after the component placing device 26 is installed on the movable table 24 to replace another, the calibration values are calculated for the positional relation (distance X4 in the X direction and distance Y4 in the Y direction) between the optical axis O1 of the board recognizing camera 25 and the center line O3 of the suction nozzle 29 of the component placing device 26 and are given by the following equations, as understood in FIG. 4.

$$X4 = Xa + Xb + Xc \quad (1a)$$

$$Y4 = Ya + Yb + Yc + L \quad (1b')$$

Further, with the movable table 24 being positioned at the predetermined position, the calibration values are calculated for the positional relation (distance X5 in the X direction and distance Y5 in the Y direction) between the optical axis O2 of the component recognizing camera 15 and the optical axis O1 of the board recognizing camera 25 and are given by the following equations.

$$X5 = Xa + Xb \quad (2a)$$

$$Y5 = Ya + Yb + L \quad (2b')$$

Further, the calibration values are calculated for the positional relation (distance X2 in the X direction and distance Y2 in the Y direction) of the component camera optical axis O2 relative to the coordinate origin. As easily understood in FIG. 1, the calibration values for the distances X2, Y2 are calculated based on the values X5, Y5 given by the aforementioned equations and the positional relation X3, Y3 recorded in the memory of the control device 23, of the circuit board camera optical axis O1 relative to the coordinate origin when the movable table 24 is positioned at the predetermined position and are given by the following equations.

$$X2 = X3 + X5 \quad (3a)$$

$$Y2 = Y3 + Y5 \quad (3b)$$

Like as mentioned earlier, the positive or negative sign of each distance Xa, Xb, . . . in the above equations changes in dependence on the positional relation between the center line O3, the optical axis O1, and the optical axis O2.

As soon as the component placing 26 has replaced another, the control device 23 for controlling the operation of the electronic component mounting device 10 first moves the movable table 24 to the aforementioned predetermined position shown in FIG. 4 and positions the movable table 24 thereat. With the reference gauge Ga being placed on the upper end member 17 over the component recognizing camera 15 in a predetermined positional relation, the control device 23 then measures the distances Xa, Ya by the board recognizing camera 25 and the distances Xb, Yb and Xc, Yc by the component recognizing camera 15. Next, the control device 23 computes the calibration values for the distance X4, Y4 by the aforementioned equations (1a) and (1b'), the calibration values for the distances X5, Y6 by the aforementioned equations (2a) and (2b'), and the calibration values for the distances X2, Y2 by the equations (3a) and (3b). Since the mounting operation of the component P on the circuit board S is the same as described in the first embodiment, the description of the mounting operation is omitted for brevity.

Although in the second embodiment, the reference gauge Ga is placed on the upper end member 17 with the first and second reference marks Gm1 and Gm2 being aligned completely in the Y direction, it may be placed on the upper end member 17 so that a line connecting the first and second reference marks Gm1 and Gm2 is inclined at a predetermined angle with respect to the Y direction (or the X direction). In this modified case, the values X4 and X5 and Y4 and Y5 in the second embodiment can be obtained by adding the X direction component and the Y direction component of the distance L respectively to X4 and X5, and Y4 and Y5 in the first embodiment.

In each of the foregoing embodiments, the method and apparatus have been described of the type that the reference gauge G or Ga is placed on the upper end member 17 each time the calibration is to be done for the positional relation X4, Y4 between the optical axis O1 of the board recognizing camera 26 and the center line O3 of the suction nozzle 29 or each time the calibration is to be done for the positional relation X2, Y2 of the optical axis O2 of the component recognizing camera 15 relative to the coordinate origin. However, in another modified case, the reference gauge G or Ga may be kept placed on the upper end member 17 all the time. Or, in a further modified case, the cover glass 18 of the upper end member 17 may be provided thereon with one Gm or two reference marks Gm1, Gm2 to be used as the reference gauge G or Ga.

(Third Embodiment)

Figure 7:
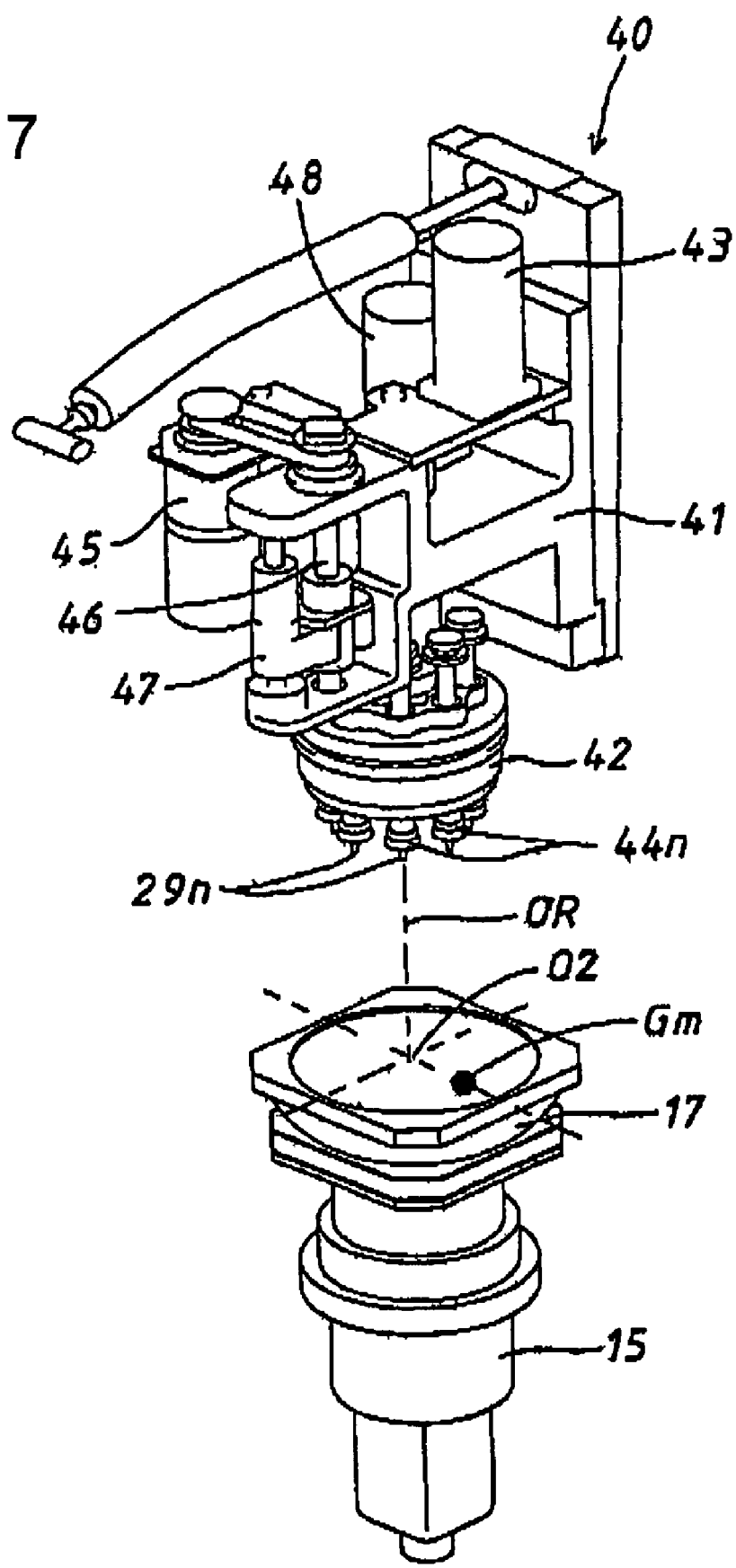
FIG. 7 is a perspective view of a component replacing device in the third embodiment.

Next, description will be made as to the third embodiment in which a component placing device 40 with a rotary head 42 is detachably or replaceably installed on the movable table 24. As shown in FIG. 7, the component placing device 40 is provided with a head frame 41 which is installed on the movable table 24. Carried on the lower part of the head frame 41 for rotary movement about a vertical axis is a cylindrical rotary head 42, which holds a plurality (e.g., eight) of spindles $44n$ to be movable reciprocatively in the vertical direction (Z direction). Each spindle $44n$ is urged upward by a compression spring (not shown) and has a suction nozzle $29n$ attached at its lower end in coaxial alignment therewith.

The rotary head 42 is intermittently rotated by a servo motor 43 mounted on the head frame 41 thereby to position the suction nozzles $29n$ at respective predetermined positions. Each spindle $44n$ which has been stopped at a mounting point (mounting station) for mounting the electronic component P at the predetermined position is lowered against the spring force of the compression spring as a nozzle lowering lever 47 is moved down with the rotation of a feed screw 46 driven by the servomotor 45, and the suction nozzle $29n$ provided on each such spindle $44n$ is also lowered. As the nozzle lowering lever 47 is lifted up by the counterclockwise rotation of the feed screw 46, the spindle $44n$ at the mounting point is lifted by the spring force of the compression spring, and the suction nozzle $29n$ provided thereon is also lifted up. All the spindles $44n$ are in driving connection with a servomotor 48 and, together with the suction nozzles $29n$ thereon, are rotated all at a time by the servomotor 48 about the respective axes. Where the component P held on the suction nozzle $29n$ of the spindle $44n$ which have been indexed to the mounting point is to be turned ($\alpha$) degrees relative to the X axis in advance of being mounted on the circuit board S, the spindle $44n$ is turned the ($\alpha$) degrees by the servomotor 48. Each suction nozzle $29n$ is connected to a negative pressure source through a conduit provided with a shutoff valve (not shown). The plural suction nozzles $29n$ are used selectively in dependence on the kind or type of the electronic component P to be held thereon.

Next, description will be made as to calibrating the rotational center position OR of the rotary head 42 by taking the images of the ends of the plural suction nozzles $29n$ at a time by the component recognizing camera 15. Since the rotational center position OR of the rotary head 42 is substantially distant from the optical axis O1 of the board recognizing camera 25, it is impossible to make the reference mark Gm and the ends of all the suction nozzles $29n$ of the rotary head 42 come in the visual field of the component recognizing camera 15 and at the same time, to make the reference mark Gm come in the visual filed of the board recognizing camera 25. Therefore, the reference gauge G is first so placed on the upper end member 17 as to make the reference mark Gm come in the visual field of the component recognizing camera 15, and then, the movable table 24 is moved to, and stopped at, a first position to make the reference mark Gm come in the visual field of the board recognizing camera 25. At this time, the board camera optical axis O1 is positioned at the coordinate position (X3, Y3 shown in FIG. 1) relative to the coordinate origin of the electronic component mounting device 10.

When the movable table 24 is at the first position, the positional relations of the optical axes O2, O1 of the component recognizing camera 15 and the board recognizing camera 25 relative to the reference marks Gm are measured by the respective cameras. Then, based on the measured positional relations, the positional relation X5, Y5 between the component camera optical axis O2 and the board camera optical axis O1 at the first position is computed by the aforementioned equations (2a) and (2b), and the coordinate position (X2, Y2) of the component camera optical axis O2 relative to the coordinate origin is obtained by the aforementioned equations (3a) and (3b). Next, the movable table 24 is moved by the servomotors 22 and 31 to the second position so that the rotational center OR of the rotary head 42 is positioned at the coordinate position (X2, Y2) of the component camera optical axis O2. At this time, as the value indicative of the distance between the optical axis O1 of the board recognizing camera 25 and the rotational center OR of the rotary head 42, there is used a value which has been in advance stored as designed value in the control device 23.

Figure 8:
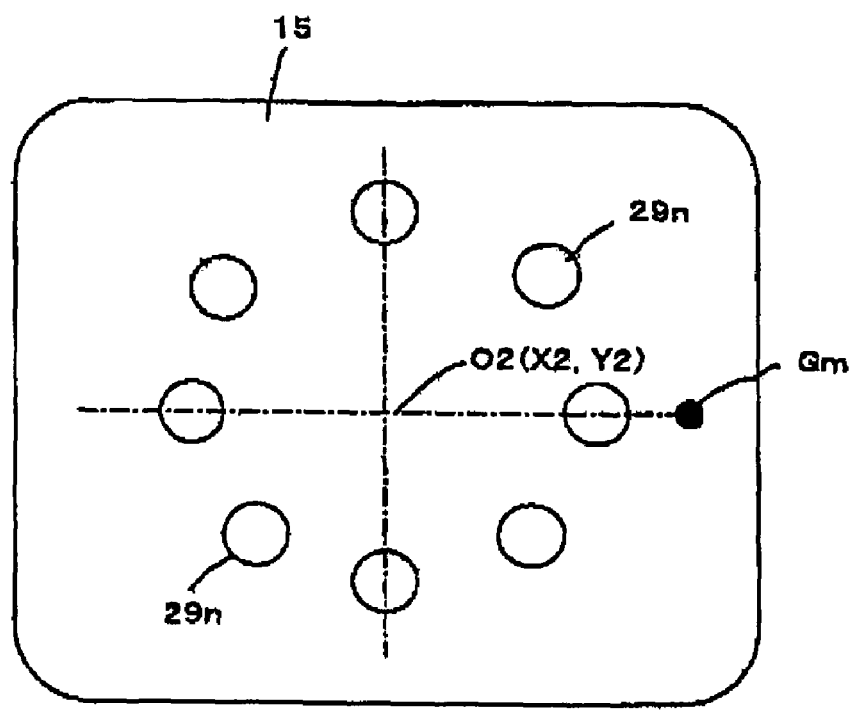
FIG. 8 is an explanatory view showing the images of the end faces of plural suction nozzles.

With the rotary head 42 being indexed to an image taking position, the end images of all the suction nozzles $29n$ are taken as shown in FIG. 8 by the component recognizing camera 15 whose optical axis O2 is positioned at the coordinate position (X2, Y2), and from the images, there are obtained coordinate positions (Xn1, Yn1) of the end centers of all the suction nozzles $29n$ with each spindle $44n$ being kept at a first rotational angular position. Since each suction nozzle $29n$ is slightly bent, the rotational center position of each spindle $44n$ which is the rotational center position of each suction nozzle $29n$ does not necessarily coincide with the end center position of each suction nozzle 29n held at the first rotational angular position. To obtain the rotational center position of each spindle 44n which is the rotational center position of each suction nozzle 29n, each spindle 44n is first positioned at the first rotational angular position as mentioned earlier to obtain the coordinate position (Xn1, Yn1) of the end center of each suction nozzle 29 and then, each spindle 44n is rotated by the servomotor 48 through 180 degrees to be positioned to a second rotational angular position, in which state a coordinate position (Xn2, Yn2) of the end center of each suction nozzle 29n held at the second rotational angular position is obtained from the image thereof taken by the component recognizing camera 15. Thus, the coordinate position obtained by averaging the coordinate positions (Xn1, Yn1) and (Xn2, Yn2) which the end center of each suction nozzle 29n takes respectively at the first and second rotational angular positions is obtained as the rotational center position (Xn, Yn) of each spindle 44n which is the rotational center position of each suction nozzle 29n. In this case, if the distance between the coordinate positions (Xn1, Yn1) and (Xn2, Yn2) that the end center of each suction nozzle 29n takes respectively at the first and second rotational angular positions is equal to or greater than a threshold value, it is judged that the deflection of the suction nozzle 29n has exceeded a tolerable value, and the replacement of the suction nozzle 29n is instructed with an alarm display or the like. It is to be noted that if the difference between the coordinate positions (Xn1, Yn1) and (Xn2, Yn2) that the end center of each suction nozzle 29n takes respectively at the first and second rotational angular positions is small, the coordinate of each spindle 44n may be taken as the coordinate position of the end center of each suction nozzle 29 which is obtained from the image thereof taken at the first or second rotational angular position.

A coordinate position (Xor, Yor) of the rotational center OR of the rotary head 42 is obtained from the coordinate positions of the rotational centers of the spindles 44n which are respectively the rotational centers of the suction nozzles 29n. And, values which compensate for the positional deviation of the rotational center OR of the rotary head 42 from the optical axis O2 of the component recognizing camera 15 are calculated by equations $\Delta Xor=Xor-X2$, $\Delta Yor=Yor-Y2$ based on the coordinate value (Xor, Yor) of the rotational center OR of the rotary head 42 and the coordinate value (X2, Y2) of the optical axis O2 of the component recognizing camera 15. The coordinate value (Xor, Yor) of the rotational center OR of the rotary head 42 is obtained first by calculating coordinate positions of four medians each between the rotational center positions of two spindles 44n which face each other with the rotational center OR therebetween and then by calculating the average values of the four medians.

When a circuit board S is loaded by the circuit board transfer device 12, the control device 23 moves the slide 21 and the movable table 24 respectively in the X direction and the Y direction, rotates the rotary head 24, takes the components Pn to be mounted on the circuit board S from the component supply device 13, and holds the components Pn respectively on the ends of the suction nozzles 29n. Then, the movable table 24 is moved to the second position to index the rotary head 42 to the image taking position, whereby the images of the components Pn held on the respective suction nozzles 29n are taken by the component recognizing camera 15 (refer to FIG. 9). When each component Pn is held on the suction nozzle 29n assigned thereto in this way, the holing center position on the image of each component Pn is to be in alignment with the rotational center of the spindle 44n associated thereto, and the coordinate position (Xpn, Ypn) of the holding center position on the image of each component Pn relative to the coordinate origin is obtained based on the holding center position on the image of each component Pn and the coordinate position (X2, Y2) of the component camera optical axis O2. A holding deviation or error of the holding center position of each component Pn from the spindle 44n assigned thereto is calculated by the equations $\Delta Xpn=Xpn-Xn$ and $\Delta Ypn=Ypn-Yn$ based on the holding center position (Xpn, Ypn) of each component Pn and the rotational center position (Xn, Yn) of the spindle 44n assigned thereto. The holding error $\Delta Xpn$, $\Delta Ypn$ of each component Pn is resolved into a radial component $\Delta Rpn$ in the radial direction extending to connect the rotational center of the rotary head 42 and the rotational center of the spindle 44n assigned thereto and into another component $\Delta Tpn$ orthogonal to the radial component $\Delta Rpn$. And, when each spindle 44n is indexed to the mounting point, the radial component $\Delta Rpn$ is used as the compensating value for the holding error in the X axis direction, while the component $\Delta Tpn$ orthogonal to the radial direction is used as the compensating value for the holding error in the Y axis direction. Each spindle 44n is indexed to the mounting point by the rotation of the rotary head 42, and the position of the movable table 24 is compensated for the compensating values $\Delta Xor$, $\Delta Yor$ for the rotational center OR of the rotary head 42 and for the compensating values $\Delta Rpn$, $\Delta Tpn$ for the holding error of each component Pn. Through these compensations, the movable table 24 is moved to a programmed or commanded mounting position to mount the component Pn on the circuit board S.

Figure 10:
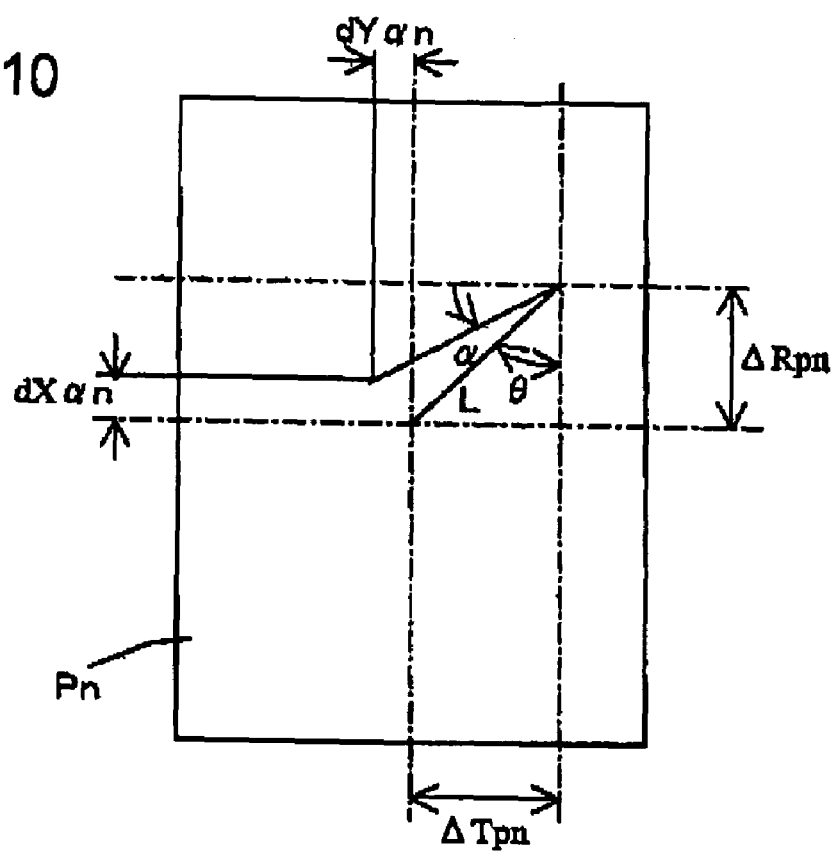
FIG. 10 is an explanatory view showing the displacement of the center position of a component which occurs due to an error in holding the same on the suction nozzle when the suction nozzle is rotated.

Further, in the case that a component P is mounted on the circuit board S with itself being turned ($\alpha$) degrees with respect to X axis, the component center is displaced due to the holding error $\Delta Rpn$, $\Delta Tpn$ defined by the deviation of the component center from the rotational center of the spindle 44n. Therefore, where the spindle 44n is turned by the ($\alpha$) degrees, the position of the movable table 24 is compensated for displaced amounts $dX\alpha n$, $dY\alpha n$ in advance of mounting the component P. As shown in FIG. 10, the displaced amounts $dX\alpha n$, $dY\alpha n$ can be obtained by the following equations.

$$dX\alpha n=\Delta Rpn-L\cos(\theta+\alpha), dY\alpha n=\Delta Tpn-L\sin(\theta+\alpha),$$

$$L^2=\Delta Rpn^2+\Delta Tpn^2, \tan\theta=\Delta Tpn/\Delta Rpn$$

In the component placing device 40 with the rotary heed 42, as mentioned earlier, the slide 21 and the movable table 24 are moved to the second position, then the rotary head 42 is indexed to the image taking position, where the end images of the suction nozzles 29n of all the spindles 44n which are lifted up to the respective lifted positions are taken by the component recognizing camera 15, and the rotational center positions (Xn, Yn) of the spindles 44n which are the rotational center positions of the respective suction nozzles 29n are calculated to be stored in the control device 23. Further, with the movable table 24 being positioned at the second position, the installation error of the component placing device 40 can be calculated based on the difference the rotational center OR (Xor, Yor) of the rotary head 42 and the coordinate position (X2, Y2) of the component camera optical axis O2.

In mounting the components P on the circuit board S, one of the spindles 44n is indexed to the mounting point through the rotation of the rotary head 42, the slide 21 and the movable table 24 are moved so that the spindle 44n having been indexed to the mounting point is positioned over a storage location of the component supply device 13 where components Pn to be held by the suction nozzle 29n have been stored, then the spindle 44n is lowered to hold one of the components Pn on the suction nozzle 29n, and the spindle 44n is lifted up. When all the spindles 44n are lowered and then, lifted up with the components Pn being held on the ends of the suction nozzles 29n thereof, the slide 21 and the movable table 24 are moved to the second position thereby to index the rotary head 42 to the image taking position, whereby the component recognizing camera 15 can take the images of the components Pn which have been held on the suction nozzles 29n of all the spindles 44n kept at the lifted positions.

The coordinate position (Xpn, Ypn) of the holding center position of each component Pn is obtained from the image of each component Pn, and the holding error of each component Pn with respect to the rotational center of the spindle 44n is obtained from the difference between the coordinate position (Xpn, Ypn) of the holding center position of each component Pn and the rotational center position (Xn, Yn) of each spindle 44n. In order that the component held on the suction nozzle 29n end of the spindle 44n having been indexed to the mounting point can be precisely mounted at a commanded position on the circuit board S, the slide 21 and the movable table 24 are moved to a commanded mounting position after or while being moved to compensate their positions for the installation error of the component placing device 40 and the holding error of the component Pn, and the spindle 44n at the mounting point is lowered to mount the component Pn on the circuit board S.

Each spindle 44n is guided on the rotary head 42 to be movable vertically reciprocatively and is moved between the lifted position and the lowered position. Therefore, the end of each suction nozzle 29n is affected by the guiding accuracy of each spindle 44n associated thereto and is displaced horizontally when each spindle 44a is moved from the lifted position to the lowered position and vice versa. The displaced amount which the end of each suction nozzle 29n is moved horizontally as the spindle 44n therefor is moved from the lifted position to the lowered position is obtained as the lowering error of each spindle 44n. Thus, where the slide 21 and the movable table 24 are moved to a mounting position after being additionally moved to compensate for a compensating value which is obtained by adding the lowering error to the installation error of the component placing device 40 and the holding error of each component Pn, each suction nozzle 29n at the lowered position can mount each component Pn more precisely at a commanded position on the circuit board S.

Figure 12:
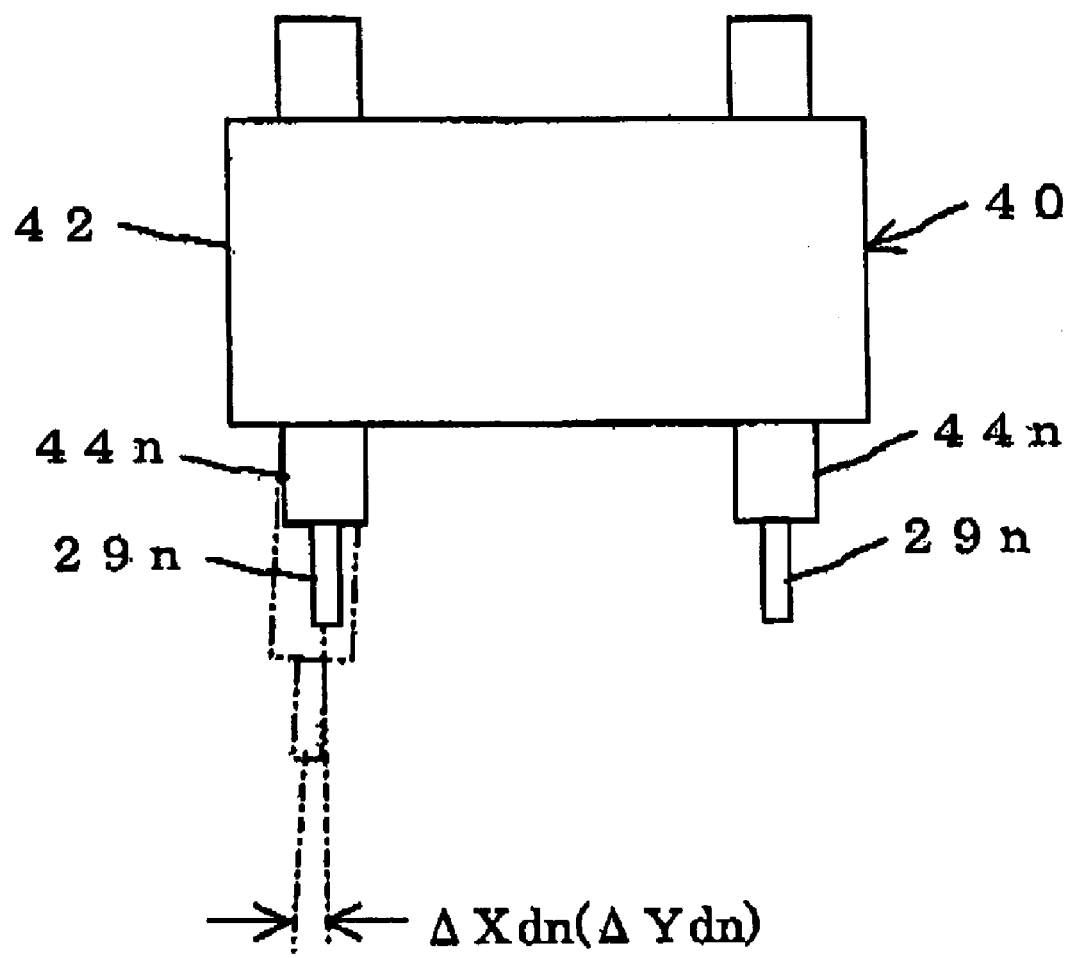
FIG. 12 is an explanatory view showing an error which is the difference between coordinate positions which the end center of a suction nozzle takes respectively when each of spindles carried in a rotary head is moved to a lifted position and a lower position.

To measure the lowering error, the slide 21 and the movable table 24 are moved to the second position, and the end images of the suction nozzles 29 of all the spindles 44n kept at the lifted position are taken by the component recognizing camera 16 to obtain the rotational center position (Xn, Yn) of each spindle 44n. In the concrete, as shown in FIG. 12, the end image of the suction nozzle 29n attached to the spindle 44n having been indexed to the mounting point is taken by the component recognizing camera 15, so that there can be obtained a coordinate position (Xnup, Ynup) of the end center of the suction nozzle 29n kept at the lifted position. Subsequently, the spindle 44n is lowered to the lowered position, and the end image of the suction nozzle 29n is taken by the component recognizing camera 15, so that there can be obtained another coordinate position (Xndn, Yndn) of the end center of the suction nozzle 29n kept at the lowered position. Thus, the lowering error can be calculated by the equations $\Delta Xnd = Xndn - Xnup$ and $\Delta Y = Yndn - Ynup$. In this manner, the lowering errors for the suction nozzles 29n of all the spindles 44n are obtained and stored in the control device 23. Although the rotational center position of each suction nozzle 29n is obtained by making the arithmetic average of the coordinate positions which the end center of each nozzle 29n takes respectively at the first and second rotational angular positions, the lowering error can be obtained from the difference between the coordinate positions which the end center of each nozzle 29n takes respectively at the lifted and lowered positions.

Next, description will be made as to individually taking the end images of the plural suction nozzles 29n of the rotary head 42, which are indexed in turn to the mounting point, by the component recognizing camera 25 and then calibrating the rotational center position of each spindle 44n which is the rotational center of each suction nozzle 29n. Also in this case, since the rotational center OR of the rotary head 42 and the optical axis O1 of the board recognizing camera 25 are substantially apart from each other, it is impossible to make the reference mark Gm and the end of the suction nozzle 29n indexed to the mounting point both come in the visual field of the component recognizing camera 15 and at the same time, make the reference mark Gm come in the visual field of the board recognizing camera 25. Therefore, in the some manner as described above, with the movable table 24 stopped at the first position, the image of the reference mark Gm is taken by the component recognizing camera 16 and the board recognizing camera 25. Then, the positional relation X5, Y5 between the board camera optical axis O1 and the component camera optical axis O2 when the movable table 24 is at the first position is calculated by the aforementioned equations (2a) and (2b), and the coordinate position (X2, Y2) of the component camera optical axis O2 with respect to the coordinate origin is obtained by the aforementioned equations (3a) and (3b). Thereafter, the movable table 24 is moved by the servomotors 22 and 31 to the second position so that the rotational center of the spindle 44 indexed to the mounting point on the rotary head 42 is positioned at the coordinate position (X2, Y2). At this time, a value which has been stored as a design value in the control device 23 is used to represent the distance between the optical axis O1 of the board recognizing camera 25 and the rotational center of the spindle 44 having been indexed the mounting point.

The end image of each of the suction nozzles 29n which are in turn indexed to the mounting point is taken by the component recognizing camera 15 whose optical axis O2 is positioned at the coordinate position (X2, Y2) (refer to FIG. 11), and the image so taken is used to obtain the coordinate position (Xn1, Yn1) of the end center of each suction nozzle 29n when the spindle 44n carrying each such suction nozzle 29n is at the first rotational angular position. Since each suction nozzle 29n is bent slightly, the end center position of each suction nozzle 29n at the first rotational angular position does not necessarily coincide with the rotational center position of each spindle 44n. To obtain a compensating value for the rotational center position of each spindle 44n, the spindles 44n are indexed in turn to the mounting point, and each spindle 44n is then positioned at the first rotational angular position, as described earlier, to obtain the coordinate position (Xn1, Yn1) at the end center of each suction nozzle 29n. Thereafter, each spindle 44n is rotated by the servomotor 45 through 180 degrees to be positioned at the second rotational angular position, and the spindles 44n are then indexed in turn to the mounting point to obtain the coordinate position (Xn2, Yn2) of the end center of each suction nozzle 29n at the second rotational angular position. The rotational center positions (Xn, Yn) of the spindles 44n are successively obtained by making the arithmetic average of the coordinate positions (Xn1, Yn1) and (Xn2, Yn2) of the end center of each suction nozzle 29n at the first and second rotational angular positions. As the compensating values ΔXn, ΔYn for the rotational center position of each spindle 44n, there are obtained the differences ΔXn=Xn−X2 and ΔYn=Yn−Y2 between the rotational center position (Xn, Yn) of each spindle 44n which has been obtained from the coordinate position of the end center of the suction nozzle 29n and the coordinate position (X2, Y2) of the component camera optical axis O2. In this case, if the distance between the coordinate positions (Xn1, Yn1) and (Xn2, Yn2) which the end center of each suction nozzle 29n takes at the first and second rotational angular positions is equal to, or greater then, a threshold value, it is judged that the deflection of the suction nozzle 29n has increased beyond the tolerable value, so that an alarm display or the like is made for replacement of the suction nozzle 29.

When a circuit board S is loaded by the circuit board transfer device 12, the control device 23 moves the slide 21 and the movable table 24 respectively in the X direction and the Y direction so that each component Pn to be mounted on the circuit board S is taken out from the component supply device 13 to be held on the end of each suction nozzle 29n, Then, the movable table 24 is moved to the second position, and then, the spindles 44n are indexed in turn to the mounting point, whereby the image of each component Pn held on each suction nozzle 29n is taken by the component recognizing camera 16. Thus, the coordinate position (Xpn, Ypn) is obtained of the center point of the taken Image of each component Pn, and the differences ΔXpn=Xpn−Xn and ΔYpn=Ypn−Yn between the coordinate position (Xpn, Ypn) and the coordinate position (Xn, Yn) of the rotational center of each spindle 44n are obtained for the holding error ΔXpn, ΔYpn of each component Pn with respect to the rotational center of each suction nozzle 29n. The movable table 24 is moved to each mounting position after being additionally moved to compensate for the compensating values ΔXn, ΔYn of the rotational center position of each spindle 44n indexed to the mounting point and the compensating values ΔXpn, ΔYpn for the holding error of each component Pn. In this way, the components Pn are successively positioned precisely over the respective target positions on the circuit board S and are in turn mounted on the same.

Further, where the component P is mounted on the circuit board 8 with itself being rotated through the (α) degrees with respect to the X axis, the center of each component Pn held on each suction nozzle 29n is displaced due to the holding error ΔXpn, ΔYpn which is the deviation of the component center from the rotational center of the spindle 44n. Therefore, where the spindle 44n is rotated the (α) degrees prior to a mounting operation, the component Pn is mounted after the position of the table 24 is compensated for the displaced amounts dXαn, dYαn of each suction nozzle 29n. In the same way as shown in FIG. 10, the displaced amounts dXαn, dYαn can be computed by the following equations.

$$dX\alpha n = \Delta Xpn - L \cos(\theta + \alpha), \; dY\alpha n = \Delta Ypn - L \sin(\theta + \alpha),$$

$$L^2 \Delta Xpn^2 + \Delta Ypn^2, \; \tan\theta = \Delta Ypn/\Delta Xpn$$

Finally, various features and the attendant advantages of the foregoing embodiments will be summarized as follows.

In a first aspect of the foregoing embodiment shown in FIGS. 1, 2, 3 and 5 for example, the movable table 24 is stopped at the predetermined position relative to the coordinate origin so that the reference mark Gm provided on the base frame 11 to be within the visual field of the component recognizing camera 15 comes in the visual field of the board recognizing camera 25. The component recognizing camera 15 and the board recognizing camera 25 detect the respective positional relations (Xb, Yb), (Xa, Ya) of their optical axes O2, O1 relative to the reference mark Gm. Thus, there can be calculated the positional relation (Xa+Xb, Ya+Yb) between the optical axes O1, O2 of the board recognizing camera 25 and the component recognizing camera 15 with the movable table 24 being at the predetermined position.

Since the reference mark Gm is provided on the base frame 11 thereby to be held stably, the respective positional relations (Xa, Ya), (Xb, Yb) of the optical axes O1, O2 of the both cameras 25, 15 relative to the reference mark Gm can be detected reliably in a stable state. And, when the movable table 24 is stopped at the predetermined position with respect to the coordinate origin, the position X2, Y2 of the optical axis O2 of the component recognizing camera 15 relative to the coordinate origin can be calibrated precisely based on the position X3, Y3 of the optical axis O1 of the board recognizing camera 25 relative to the coordinate origin.

In a second aspect of the foregoing embodiment shown in FIGS. 2, 3 and 5 for example, the movable table 24 is positioned so that the reference mark Gm provided on the base frame 11 comes in the visual filed of-the board recognizing camera 25 and at the same time, the end of the component pick-up portion 29 of the component placing device 26 comes in the visual field of the component recognizing camera 15. The board recognizing camera 25 detects the positional relation (Xa, Ya) of its optical axis O1 relative to the reference mark Gm. The component recognizing camera 15 detects the positional relation (Xb, Yb) of its optical axis O2 relative to the reference mark Gm and the positional relation (Xc, Yc) of its optical axis O2 relative to the center line O3 of the component pick-up portion 29. Thus, there can be calculated the positional relation (X4, Y4) of the center line O3 of the component pick-up portion 29 relative to the optical axis O1 of the board recognizing camera 25.

In this calibration method of the second aspect, since the reference mark Gm is stably held by being provided on the base frame 11, the positional relation (Xa, Ya) between the optical axis O1 of the board recognizing camera 25 and the reference mark Gm and the positional relations (Xb, Yb), (Xc, Yc) of the optical axis O2 of the component recognizing camera 15 relative to the reference mark Gm and the center line O3 of the component pick-up portion 29 can be detected reliably in a stable state. Thus, it becomes possible to highly precisely calibrate the positional relation (X4, Y4) of the center line O3 of the component pick-up portion 29 relative to the optical axis O1 of the board recognizing camera 25. Since the positional relation (X4, Y4) between the optical axis O1 of the board recognizing camera 25 and the center line O3 of the component pick-up portion 29 of the component placing device 26 can be calibrated highly precisely in this manner, each component P can be mounted correctly and precisely at the commanded coordinate position on the circuit board S.

In a third aspect of the foregoing embodiment shown in FIG. 4 for example, the first reference mark Gm1 of the first and second reference marks Gm1, Gm2 which are provided on the base frame 11 in the predetermined positional relation (L) always resides in the visual field of the component recognizing camera 15. The movable table 24 is positioned to make the second reference mark Gm2 come in the visual filed of the board recognizing camera 25 and at the same time, to make the end of the component pick-up portion 29 of the component placing device 26 come in the visual field of the component recognizing camera 15. The board recognizing camera 25 detects the positional relation (Xa, Ya) of its optical axis O1 relative to the second reference mark Gm2. The component recognizing camera 15 detects respective positional relations (Xb, Yb), (Xc, Yc) of its optical axis O2 relative to the first reference mark Gm1 and relative to the center line O3 of the component pick-up portion 29. Thus, there can be calculated the positional relation (X4, Y4) of the center line O3 of the component pick-up portion 29 relative to the optical axis O1 of the board recognizing camera 25 based on the positional relation (Xa, Ya) of its optical axis O1 relative to the second reference mark Gm2, positional relations (Xb, Yb), (Xc, Yc) of its optical axis O2 relative to the first reference mark Gm1 and relative to the center line O3 of the component pickup portion 29, and the positional relation (L) between the first and second reference marks Gm1, Gm2.

Therefore, in addition to the advantages in the second aspect mentioned above, it can advantageously be attained to calibrate the positional relation (X4, Y4) between the optical axis O1 of the board recognizing camera 25 and the center line O3 of the component pick-up portion 29 with the movable table 24 being stopped at a single place even in the case that the distance between the optical axis O1 of the board recognizing camera 25 and the center line O3 of the component pick-up portion 29 is large.

In a fourth aspect of the foregoing embodiment shown in FIG. 2 and 5 for example, the reference mark Gm always resides in the visual field of the component recognizing camera 15. The movable table 24 is positioned to a first position to make the reference mark Gm come in the visual field of the board recognizing camera 25, and the component recognizing camera 15 and the board recognizing camera 25 detect respective positional relations (Xa, Ya), (Xb, Yb) of their optical axes O1, O2 relative to the reference mark 24. After or prior to this step, the movable table 24 is positioned to the second position to make the end of the component pick-up portion 29n of the component placing device 49 come in the visual field of the component recognizing camera 15, and the component recognizing camera 15 detects the positional relation (Xc, Yc) between the optical axis O2 of the component recognizing camera 15 and the center line O3 of the component pick-up portion 29. Thus, the positional relation (X4, Y4) between the optical axis O1 of the board recognizing camera 25 and the center line O3 of the component pick-up portion 29 can be calculated based on (1) the positional relation (Xa+Xb, Ya+Yb) between the axes O1, O2 of the board recognizing camera 25 and the component recognizing camera 15 detected with the movable table 24 being positioned at the first position; (2) the positional relation (Xc, Yc) between the optical axis O2 of the component recognizing camera 15 and the center line O3 of the component pick-up portion 29 detected with the movable table 24 being positioned at the second position; and (3) the positional relation between the first and second positions.

Therefore, in addition to the advantages in the fourth aspect mentioned above, it can advantageously be attained only by providing the single reference mark Gm on the base frame 11 to be within the visual field of the component recognizing camera 25 to calibrate the positional relation (X4, Y4) between the optical axis O1 of the board recognizing camera 25 and the center line O3 of the component pick-up portion 29 even in the case that the distance between the optical axis O1 of the board recognizing camera 25 and the center line O3 of the component pick-up portion 29 is large.

In a fifth aspect of the foregoing embodiment shown in FIGS. 3, 4 and 7 for example, the image of the reference mark Gm provided on the base frame 11 is taken by the component recognizing camera 15. The image of the reference mark Gm or another reference mark (e.g., Gm2) of the predetermined positional relation thereto (e.g., L) is taken by the board recognizing camera 25 with the movable table 24 being stopped at the predetermined position relative to the coordinate origin. The coordinate position X2, Y2 of the optical axis O2 of the component recognizing camera 15 relative to the coordinate origin is calibrated based on respective positional relations (Xb, Yb), (Xa, Ya+L) between the optical axes O2, O1 of the component recognizing camera 15 and the board recognizing camera 25 and the reference mark Gm which relations are detected by these cameras. The movable table 24 is moved to the predetermined potion to position the rotational center OR of the rotary head 42 at the calibrated coordinate position of the optical axis O2 of the component recognizing camera 15. The end images of suction nozzles 29n attached to all the spindles 44n are taken to obtain rotational centers of all the spindles 44n based on the end images of the suction nozzles 29n. Thus, there can be obtained as a compensation value an error in installing the rotary head 42 on the movable table 24 based on the rotational center position OR of the rotary head 42 which is obtained from the rotational centers of all the spindles 44n and based on the coordinate position of the optical axis O2 of the component recognizing camera 15. Therefore, in addition to the advantage of the first aspect, it can be realized to effectively obtain the installation error of the rotary head 42 on the movable table 24 as a compensating value.

In a sixth aspect of the foregoing embodiment shown in FIG. 7 and 8 for example, the end images of the suction nozzles 29 are taken by the component recognizing camera 15 respectively when all the spindles 44n are positioned selectively at a first rotational angular position and a second rotational angular position which is rotated 180 degrees from the first rotational angular position. The rotational center position of each spindle 44n is obtained by making the arithmetic average of center positions obtained from the end images of each suction nozzle 29n at the first and second rotational angular positions. Thus, the rotational center OR of the rotary head 42 can be obtained precisely based on the rotational center position of each spindle 44n which is obtained to exclude the deflection of each suction nozzle 29n attached thereto.

In a seventh aspect of the foregoing embodiment shown in FIG. 7 and 12 for example, the end image of the suction nozzle 29n of each spindle 44n indexed to a mounting point is taken by the component recognizing camera 15 respectively when each spindle 44n is at the lifted position and the lowered position. As a compensating value, the lowering error of each spindle 44n is obtained based on positions of the end images of each spindle 44n at the lifted and lowered positions. Thus, the movable table 24 can be moved to commanded mounting positions in the state that compensation has been made for the error $\Delta Xdn$, $\Delta Ydn$ caused by the guiding accuracy at which each spindle 44n is moved vertically on the rotary head 42, so that each suction nozzle 29n when at the lowered position can correctly and precisely mount the component P at the commanded position on the circuit board S.

Figure 9:
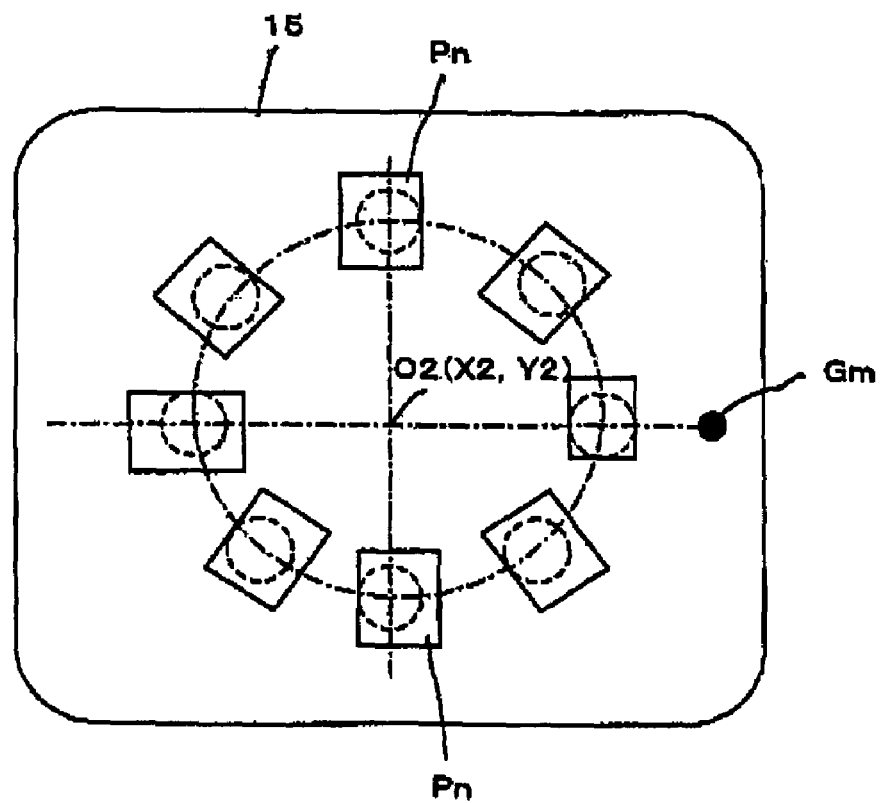
FIG. 9 is an explanatory view showing the images of components held on the plural suction nozzles.

In an eighth aspect of the foregoing embodiment shown in FIGS. 7, 9 and 10 for example, the movable table 24 is moved to the predetermined position that the rotational center of the rotary head 42 is positioned to the calibrated coordinate position of the optical axis O2 of the component recognizing camera 15, with the suction nozzle 29n of each spindle 44n holding a component Pn. The component recognizing camera 15 takes the image of each component Pn held on the end of each suction nozzle 29n. Then, as a compensating value, there can be obtained holding error ΔRpn, ΔTpn of each component Pn relative to the rotational center of each spindle O2 based on the image of each component Pn. Accordingly, the holding error ΔRpn, ΔTpn can be effectively obtained for the components Pn held on the plural spindles 44n.

Figure 11:
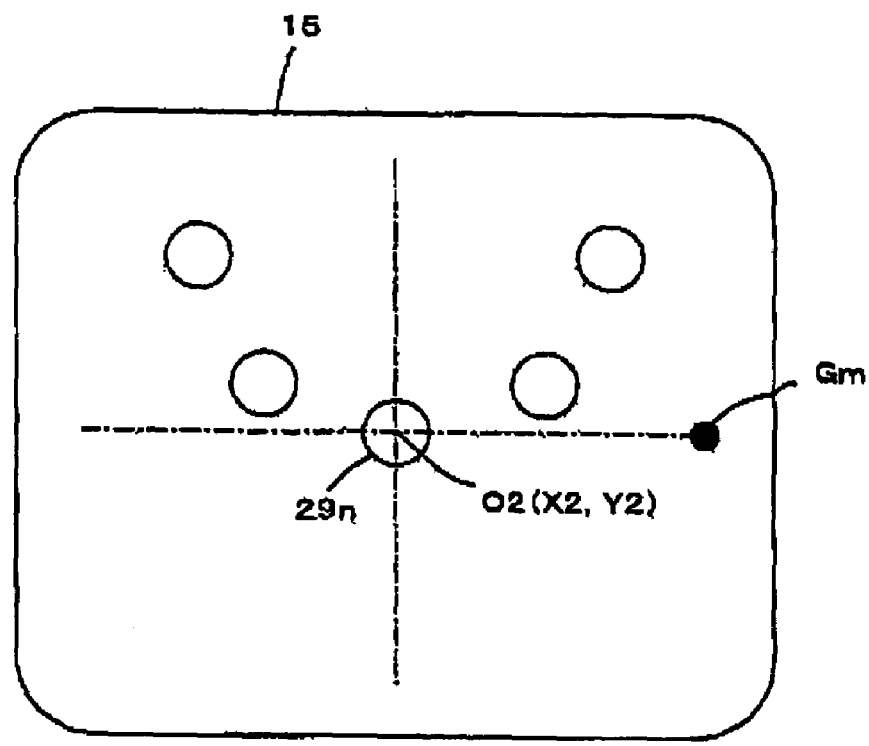
FIG. 11 is a representation showing the image that is taken with one of suction nozzles indexed to a mounting point being aligned a component camera optical axis O2.

In an ninth aspect of the foregoing embodiment shown in FIGS. 4, 7 and 11 for example, the image of the reference mark Gm provided on the base frame 11 is taken by the component recognizing camera 15. The Image of the reference mark Gm or another reference mark Gm2 of the predetermined positional relation (L) thereto is taken by the board recognizing camera 25 with the movable table 24 being stopped at the predetermined position relative to the coordinate origin. Then, the coordinate position X2, Y2 of the optical axis O2 of the component recognizing camera 15 relative to the coordinate origin can be calibrated based on respective positional relations (Xb, Yb), (Xa, Ya) between the optical axes O2, O1 of the component recognizing camera 15 and the board recognizing camera 25 and the reference mark Gm which relations are detected by these cameras, Then, the movable table 24 is moved to the predetermined potion so that the rotational center of the spindle 29n indexed to the mounting point is positioned to the calibrated coordinate position of the optical axis O2 of the component recognizing camera 15. The end image of the suction noble 29n attached to each spindle 44n is taken by the component recognizing camera 25 respectively when each spindle 44n is positioned at the first rotational angular position and the second rotational angular position which is rotated through 180 degrees from the first rotational angular position. Thus, the rotational center position of each spindle 44n is obtained by making the arithmetic average of center positions of end images of each suction nozzle 29n indexed to the mounting point which images have been taken respectively when each suction nozzle 29n is rotated to the first and second rotational angular positions. Then, the compensating value for the rotational center position of each spindle 44n can be obtained based on the rotational center position at the mounting point obtained from the end images and a designed rotational center position of each spindle 44n. Therefore, in addition to the advantage of the first aspect, it can be realized to precisely obtain the compensation value for the center position of each of the plural suction nozzles 29n attached to the rotary head 42. Further, the compensation can be made for the deflection of each suction nozzle 29n.

In a tenth aspect of the foregoing embodiment shown in FIGS. 2, 3 and 6 for example, the reference mark Gm comes in the visual fields of the component recognizing camera 15 and the board recognizing camera 25 when the movable table 24 is positioned at the predetermined position relative to the coordinate origin. The component recognizing camera 15 and the board recognizing camera 25 detect the positional relation (Xa+Xb, Ya+Yb) between their optical axes O1, O2 when the movable table 24 is positioned at the predetermined position, based on respective positional relations (Xb, Yb), (Xa, Ya) of the reference mark Gm relative to the optical axes O2, O1 thereof.

In the tenth aspect of the foregoing embodiment, since the reference mark Gm is stably held by being provided on the base frame 11, there can be provided a calibration device in an electronic component mounding apparatus which is capable of reliably detecting the respective positional relations (Xb, Yb), (Xa, Ya) of the reference mark Gm relative to the optical axes O2, O1 of the respective cameras 15, 25 and which is capable of highly precisely calibrating the position of the optical axis O2 of the component recognizing camera 15 relative to the coordinate origin based on the position of the optical axis O1 of the board recognizing camera 25 relative to the coordinate origin when the movable table 24 is stopped at the predetermined position.

In an eleventh aspect of the foregoing embodiment shown in FIGS. 4 and 5 for example, the first reference mark Gm1 of the first and second reference marks Gm1, Gm2 are provided on the base frame 11 in the predetermined positional relation (L). When the movable table 24 is positioned to the predetermined position to make the end of the component pick-up portion 29 of the component placing device 26 come in the visual field of the component recognizing camera 15, the first reference mark Gm1 comes within the visual field of the component recognizing camera 15, while the second reference mark Gm2 comes within the visual field of the board recognizing camera 25. Thus, the positional relation (X4, Y4) between the optical axis O1 of the board recognizing camera 25 and the center line O3 of the component pick-up portion 29 can be calculated based on (1) the positional relation (Xa, Ya) between the optical axis O1 of the board recognizing camera 25 and the second reference mark Gm2 which relation is detected by the board recognizing camera 25, (2) positional relations (Xb, Yb), (Xc, Yc) of the first reference mark Gm1 and the center line O3 of the component pick-up portion 29 relative to the optical axis O2 of the component recognizing camera 15 which relations are detected by the component recognizing camera 15, and (3) the positional relation (L) between the first and second reference marks Gm1, Gm2.

Therefore, in addition to the advantage of the tenth aspect mentioned above, it can advantageously attained to calibrate the positional relation (X4, Y4) between the optical axis O1 of the board recognizing camera 25 and the center line O3 of the component pick-up portion 29 with the movable table 24 being stopped at a single place even in the case that the distance between the optical axis O1 of the board recognizing camera 25 and the center line O3 of the component pick-up portion 29 is large.

In a twelfth aspect of the foregoing embodiment shown in FIG. 4 for example, the first and second reference marks Gm1, Gm2 are provided on the reference gauge Ga. Therefore, the calibration can be effected highly precisely by detachably setting the reference gauge Ga on the base frame 11 only when the calibration is to be done.

Obviously, numerous modifications and variations of the present invention are possible in light of the above teachings. It is therefore to be understood that within the scope of the appended claims, the present invention may be practiced otherwise than as specifically described herein.

What is claimed is:

1. A calibration method in an electronic component mounting apparatus having a circuit board transfer device mounted on a base frame for performing the loading, unloading and positioning of circuit boards; a movable table supported on the base frame to be movable in two directions of X and Y directions; a component placing device installed on the movable table for taking out components supplied by a component supply device and mounting the components on the circuit board positioned on the circuit board transfer device; a board recognizing camera fixed on the movable table; and a component recognizing camera fixed on the base frame; wherein the component placing device is replaceable with another component placing device different in performance, the method comprising the steps of:

provide a reference mark at a stationary position on the base frame to reside in the visual field of the component recognizing camera;

positioning the movable table to a predetermined position relative to a coordinate origin to make the reference mark at the stationary position come in the visual field of the board recognizing camera; and calculating a positional relation between optical axes of the board recognizing camera and the component recognizing camera when the movable table is positioned at the predetermined position, based on respective positional relations of the reference mark, at the stationary position, relative to the optical axes of the component recognizing camera and the board recognizing camera, the respective positional relations being detected by the component recognizing camera and the board recognizing camera.

2. A calibration method in an electronic component mounting apparatus having a circuit board transfer device mounted on a base frame for performing the loading, unloading and positioning of circuit boards; a movable table supported on the base frame to be movable in two directions of X and Y directions; a component placing device installed on the movable table for taking out components supplied by a component supply device and mounting the components on the circuit board positioned on the circuit board transfer device; a board recognizing camera fixed on the movable table; and a component recognizing camera fixed on the base frame; wherein the component placing device is replaceable with another component placing device different in performance, the method comprising the steps of:

providing a reference mark on the base frame to reside in the visual field of the component recognizing camera;

positioning the movable table to make the reference mark come in the visual field of the board recognizing camera and at the same time, to make the end of a component pick-up portion of the component placing device come in the visual field of the component recognizing camera; and calculating a positional relation between the board recognizing camera and a center line of the component pick-up portion based on the following positional relations (1) and (2):

(1) a positional relation between an optical axis of the board recognizing camera and the reference mark which relation is detected by the board recognizing camera, and (2) positional relations of the reference mark and the center line of the component pick-up portion relative to an optical axis of the component recognizing camera which relations are detected by the component recognizing camera.

3. A calibration method in an electronic component mounting apparatus having a circuit board transfer device mounted on a base frame for performing the loading, unloading and positioning of circuit boards; a movable table supported on the base frame to be movable in two directions of X and Y directions; a component placing device installed on the movable table for taking out components supplied by a component supply device and mounting the components on the circuit board positioned on the circuit board transfer device; a board recognizing camera fixed on the movable table; and a component recognizing camera fixed on the base frame; wherein the component placing device is replaceable with another component placing device different in performance, the method comprising the steps of:

providing the base frame with first and second reference marks of a predetermined positional relation with the first reference mark residing in the visual field of the component recognizing camera;

positioning the movable table to make the second reference mark come in the visual field of the board recognizing camera and at the same time, to make the end of a component pick-up portion of the component placing device come in the visual field of the component recognizing camera; and calculating a positional relation between the optical axis of the board recognizing camera and a center line of the component pick-up portion based on the following positional relations (1)–(3):

(1) a positional relation between the optical axis of the board recognizing camera and the second reference mark which relation is detected by the board recognizing camera, (2) positional relations of the first reference mark and the center line of the component pick-up portion relative to an optical axis of the component recognizing camera which relations are detected by the component recognizing camera, and (3) the positional relation between the first and second reference marks.

4. A calibration method in an electronic component mounting apparatus having a circuit board transfer device mounted on a base frame for performing the loading, unloading and positioning of circuit boards; a movable table supported on the base frame to be movable in two directions of X and Y directions a component placing device installed on the movable table for taking out components supplied by a component supply device and mounting the components on the circuit board positioned on the circuit board transfer device; a board recognizing camera fixed on the movable table; and a component recognizing camera fixed on the base frame; wherein the component placing device is replaceable with another component placing device different in performance, the method comprising:

a first step of providing a reference mark on the base frame to reside in the visual field of the component recognizing camera;

a second step of positioning the movable table to a first position to make the reference mark come in the visual field of the board recognizing camera and detecting respective positional relations of the reference mark relative to optical axes of the component recognizing camera and the board recognizing camera by the use of these cameras;

a third step of positioning the movable table to a second position to make the end of a component pick-up portion of the component placing device come in the visual field of the component recognizing camera and detecting a positional relation between the optical axis of the component recognizing camera and a center line of the component pick-up portion by the use of the component recognizing camera, one of the second and third steps being performed prior to the other; and calculating a positional relation between the optical axis of the board recognizing camera and the center line of the component pick-up portion based on the following positional relations (1)–(3):
(1) the positional relation between the axes of the board recognizing camera and the component recognizing camera detected with the movable table being positioned at the first position;
(2) the positional relation between the optical axis of the component recognizing camera and the center line of the component pick-up portion detected with the movable table being positioned at the second position; and
(3) a positional relation between the first and second positions.

5. A calibration device in an electronic component mounting apparatus having a circuit board transfer device mounted on a base frame for performing the loading, unloading and positioning of circuit boards; a movable table supported on the base frame to be movable in two directions of X and Y directions; a component placing device installed on the movable table for taking out components supplied by a component supply device and mounting the components on the circuit board positioned on the circuit board transfer device; a board recognizing camera fixed on the movable table; and a component recognizing camera fixed on the base frame; wherein the component placing device is replaceable with another component placing device different in performance, the calibration device including:
a reference mark provided at a stationary position on the base frame to come in the visual fields of the component recognizing camera and the board recognizing camera when the movable table is positioned at a predetermined position relative to a coordinate origin of the electronic component mounting apparatus; and
calculation means for calculating a positional relation between optical axes of the board recognizing camera and the component recognizing camera when the movable table is positioned at the predetermined position, based on respective positional relations of the reference mark, at the stationary position, relative to the optical axes of the component recognizing camera and the board recognizing camera, the respective positional relations being detected by the component recognizing camera and the board recognizing camera.

6. A calibration device in an electronic component mounting apparatus having a circuit board transfer device mounted on a base frame for performing the loading, unloading and positioning of circuit boards; a movable table supported on the base frame to be movable in two directions of X and Y directions; a component placing device installed on the movable table for taking out components supplied by a component supply device and mounting the components on the circuit board positioned on the circuit board transfer device; a board recognizing camera fixed on the movable table; and a component recognizing camera fixed on the base frame; wherein the component placing device is replaceable with another component placing device different in performance, the calibration device including:
first and second reference marks provided on the base frame in a predetermined positional relation so that when the movable table is positioned to a predetermined position to make the end of a component pick-up portion of the component placing device come in the visual field of the component recognizing camera, the first reference mark comes in the visual field of the component recognizing camera, while the second reference mark comes in the visual field of the board recognizing camera; and
calculation means for calculating a positional relation between the optical axis of the board recognizing camera and a center line of the component pick-up portion based on the following positional relations (1)–(3):
(1) a positional relation between the optical axis of the board recognizing camera and the second reference mark which relation is detected by the board recognizing camera,
(2) positional relations of the first reference mark and the center line of the component pick-up portion relative to an optical axis of the component recognizing camera which relations are detected by the component recognizing camera, and
(3) the positional relation between the first and second reference marks.

7. The calibration device as set forth in claim 6, wherein the first and second reference marks are provided on a reference gauge, and wherein the reference gauge is detachably set on a support member secured to the base frame.

* * * * *